(12) United States Patent
Benosman et al.

(10) Patent No.: US 10,353,008 B2
(45) Date of Patent: Jul. 16, 2019

(54) HYBRID BATTERY STATE SENSOR

(71) Applicant: Mitsubishi Electric Research Laboratories, Inc., Cambridge, MA (US)

(72) Inventors: Mouhacine Benosman, Boston, MA (US); Chun Wei, Lincoln, NE (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 0 days.

(21) Appl. No.: 15/286,859

(22) Filed: Oct. 6, 2016

(65) Prior Publication Data

US 2018/0100898 A1 Apr. 12, 2018

(51) Int. Cl.
*H01M 10/48* (2006.01)
*G01R 31/367* (2019.01)
*B60L 58/16* (2019.01)
*B60L 58/12* (2019.01)

(52) U.S. Cl.
CPC ............ *G01R 31/367* (2019.01); *B60L 58/12* (2019.02); *B60L 58/16* (2019.02); *B60L 2240/547* (2013.01); *B60L 2240/549* (2013.01); *B60L 2240/80* (2013.01); *B60L 2260/44* (2013.01); *Y02T 10/705* (2013.01); *Y02T 10/7011* (2013.01); *Y02T 10/7044* (2013.01)

(58) Field of Classification Search
USPC .......................................................... 702/63
See application file for complete search history.

(56) References Cited

U.S. PATENT DOCUMENTS

| | | | | |
|---|---|---|---|---|
| 9,843,069 B2* | 12/2017 | Marcicki | ........... | H01M 10/0525 |
| 2010/0121587 A1* | 5/2010 | Vian | ................ | H01M 10/425 |
| | | | | 702/63 |
| 2015/0355283 A1* | 12/2015 | Lee | .................... | G01R 31/3842 |
| | | | | 702/63 |
| 2016/0011272 A1* | 1/2016 | Zhang | ................. | G01R 31/367 |
| | | | | 702/63 |

* cited by examiner

*Primary Examiner* — Lam S Nguyen
(74) *Attorney, Agent, or Firm* — Gennadiy Vinokur; James McAleenan; Hironori Tsukamoto

(57) ABSTRACT

A method for estimating a state of a battery determines, using a sensor, physical quantities of the battery indicative of a charge of the battery to produce a measured charge of the battery. The method also estimates the physical quantities of the battery using a model of the battery stored in a memory to produce an estimated charge of the battery and updates at least one parameter of the model of the battery to reduce a difference between the measured charge of the battery and the estimated charge of the battery. The method determines the state of the battery using the updated model of the battery.

18 Claims, 20 Drawing Sheets

HYBRID BATTERY STATE SENSOR

FIELD

The present disclosure relates to methods and systems for a battery state estimation. More particularly, the present disclosure relates to a sensor for estimating the state of a rechargeable battery.

BACKGROUND

Knowledge of a state of a battery is important for a number of battery management applications. For example, state of the battery can include state of charge (SoC), which is defined as the percentage of available charge remaining in the battery. The SoC gives an indication when the battery should be recharged, which can enable battery management systems to improve the battery life by protecting the battery from over-discharge and over-charge events. Another indicator of the health of a battery is the state of power (SoP), which describes the maximum charging and discharging capabilities of the battery. For example, the estimation of the peak power capability of the battery is needed to determine the maximum available power for acceleration and regenerating braking of the electric vehicles, thus avoiding over-charging or over-discharging the battery. Accordingly, there is a need to estimate a state of a battery.

Rechargeable batteries store energy through a reversible chemical reaction. Conventionally, rechargeable batteries provide a lower cost of use and result in supporting Green initiatives toward impacting the environmental than non-rechargeable batteries. For example, Lithium-ion (Li-ion) rechargable batteries have been widely deployed as a major energy storage component in numerous applications including consumer electronics, residential rooftop solar photo-voltaic systems, electric vehicles, smart grid systems, etc. At least some main advantages of Li-ion batteries over other types of batteries with different chemistries are low self-discharge rate, high cell voltage, high energy density, light-weight, long lifetime, and low maintenance.

However, a Li-ion battery and other types of batteries include a chemical energy storage source, and this chemical energy cannot be directly accessed. Conventional state of the battery estimation techniques are usually classified into model-based and data-driven based methods. Model-based methods exploit models capturing battery's chemical and/or physical processes. Data-driven methods use training data to map the measurements of physical quantities of the battery to corresponding values of its state. However, the processes in the battery are very complex and can vary over time, which reduces the accuracy of the conventional state estimation methods. Accordingly, there is still a need for a system and a method for estimating the state of a rechargeable battery.

SUMMARY

Some embodiments are based on recognition that when accurate model of a battery is known, such a model can be used to estimate a state of the battery. However, it can be difficult to estimate parameters of the model due to complexity of the chemical and other processes inside the battery. Moreover, the parameters of the model of the battery can change over time, which make the initially estimated model less accurate.

Some embodiments are based on recognition that data-driven methods for estimating the state of the battery can be used to overcome the limitations of the model-based methods. However, due to infamous complexity of the processes inside the battery, the training of the mapping between, e.g., the charge and the state of the battery, can require a complex training process, which is possible only when ground truth data is available. Such ground truth data may be available in advance making the initial mapping possible. However, the parameters of the battery can change over time, which can make the initial mapping inaccurate.

Some embodiments are based on realization that it is possible to adapt the model based and data driven methods to form a hybrid sensor for estimation of the state of the battery. To that end, some embodiments modify the data driven methods to estimate parameters of the model of the battery, instead of directly estimating the state of the battery. After the model of the battery is updated, the state of the battery can be estimated using a model based method.

Some embodiments are based on realization that data driven method can update the parameters of the model of the battery based on comparison of, for example, the measured charge of battery and the charge of the battery estimated using the parameters of the model. In such a manner, the measured charge of the battery can provide the ground truth information that can be used for the model update over the lifespan of the battery.

One embodiment is based on additional realization that because the parameters of the model can be adjusted to reflect the actual performance of the battery, the model of the battery can be simplified. For example, different embodiments, additionally or alternatively to the usage of the models representing chemical processes inside the battery, use electric and kinetic models of the battery. Such a model simplification reduces computational requirements for the processor determining the state of the battery.

One embodiment is based on realization that a model-free extremum-seeking method can be used to update the parameters of the model. For example, the extremum-seeking can iteratively perturb the parameter of the model with a perturbation signal having a predetermined frequency until a termination condition is met to determine the parameters that can reduce the difference between the measured and the estimated charge of the battery. The extremum-seeking is a model free learning method and therefore can be used for model update. Also, there can be a need to update multiple parameters of the model. The extremum-seeking can be advantageously adapted for concurrent update of multiple parameters.

Accordingly, one embodiment discloses a method for estimating a state of a battery. The method includes determining, using a sensor, physical quantities of the battery indicative of a charge of the battery to produce a measured charge of the battery; estimating the physical quantities of the battery using a model of the battery stored in a memory to produce an estimated charge of the battery; updating at least one parameter of the model of the battery to reduce a difference between the measured charge of the battery and the estimated charge of the battery; and determining the state of the battery using the updated model of the battery. The steps of the method are performed by a processor operatively connected to the memory and the sensor.

Another embodiment discloses a system for estimating a state of a battery, comprising: a sensor to measure physical quantities of the battery indicative of a charge of the battery to produce a measured charge of the battery; a memory to store a model of the battery; a parameter learning controller to update at least one parameter of the model of the battery to reduce a difference between the measured charge of the battery and a charge of the battery estimated using the model of the battery; and a processor to determine the state of the battery using the updated model of the battery.

Yet another embodiment discloses a non-transitory computer readable storage medium embodied thereon a program executable by a processor for performing a method, the method comprising: determining, using a sensor, physical quantities of the battery indicative of a charge of the battery to produce a measured charge of the battery; estimating the physical quantities of the battery using a model of the battery stored in a memory to produce an estimated charge of the battery; updating at least one parameter of the model of the battery to reduce a difference between the measured charge of the battery and the estimated charge of the battery; and determining the state of the battery using the updated model of the battery.

DETAILED DESCRIPTION

Figure 1A:
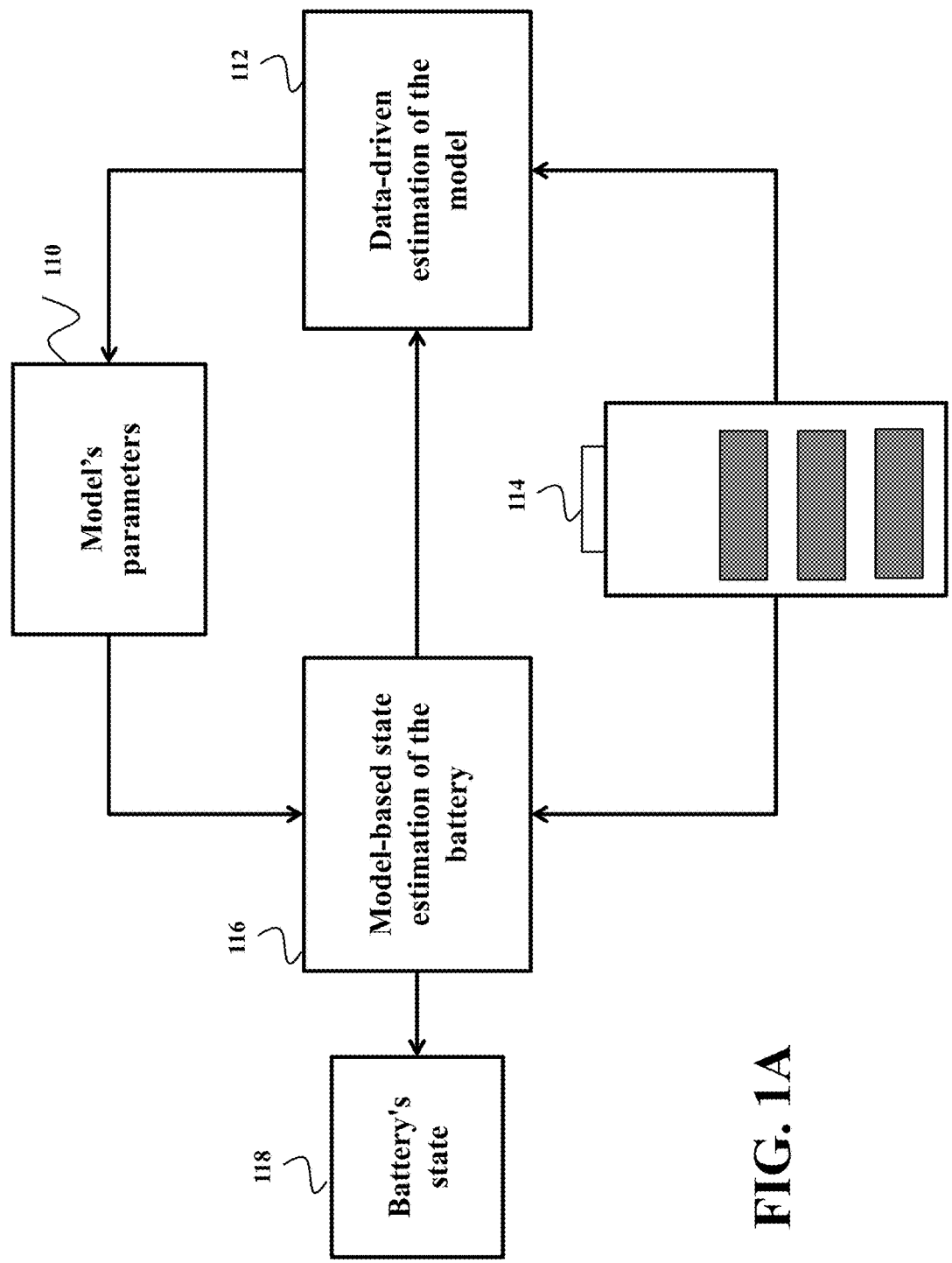
FIG. 1A is a block diagram illustrating principles of a hybrid sensor for estimating a state of a battery according to one embodiment.

FIG. 1A shows a block diagram illustrating principles of a hybrid sensor for estimating a state 118 of a battery 114 according to one embodiment. The embodiment is based on realization that it is possible to adapt the model based and data driven methods to form a hybrid sensor for estimation of the state of the battery. To that end, some embodiments modify data driven method 112 to estimate parameters 110 of the model 116 of the battery, instead of directly estimating the state of the battery. After the model 110 of the battery is updated, the state 118 of the battery 114 can be estimated using a model based method 116.

Some embodiments are based on realization that data driven method can update the parameters of the model of the battery based on comparison of, for example, the measured charge of battery and the charge of the battery estimated using the parameters of the model. In such a manner, the measured charge of the battery can provide the ground truth information that can be used for the model update over the lifespan of the battery. Additionally, some embodiments are based on realization that different model-free parameter learning methods can be used to update the parameters of the model. For example, an extremum-seeking is a model free learning method and therefore can be used for model update.

Figure 1B:
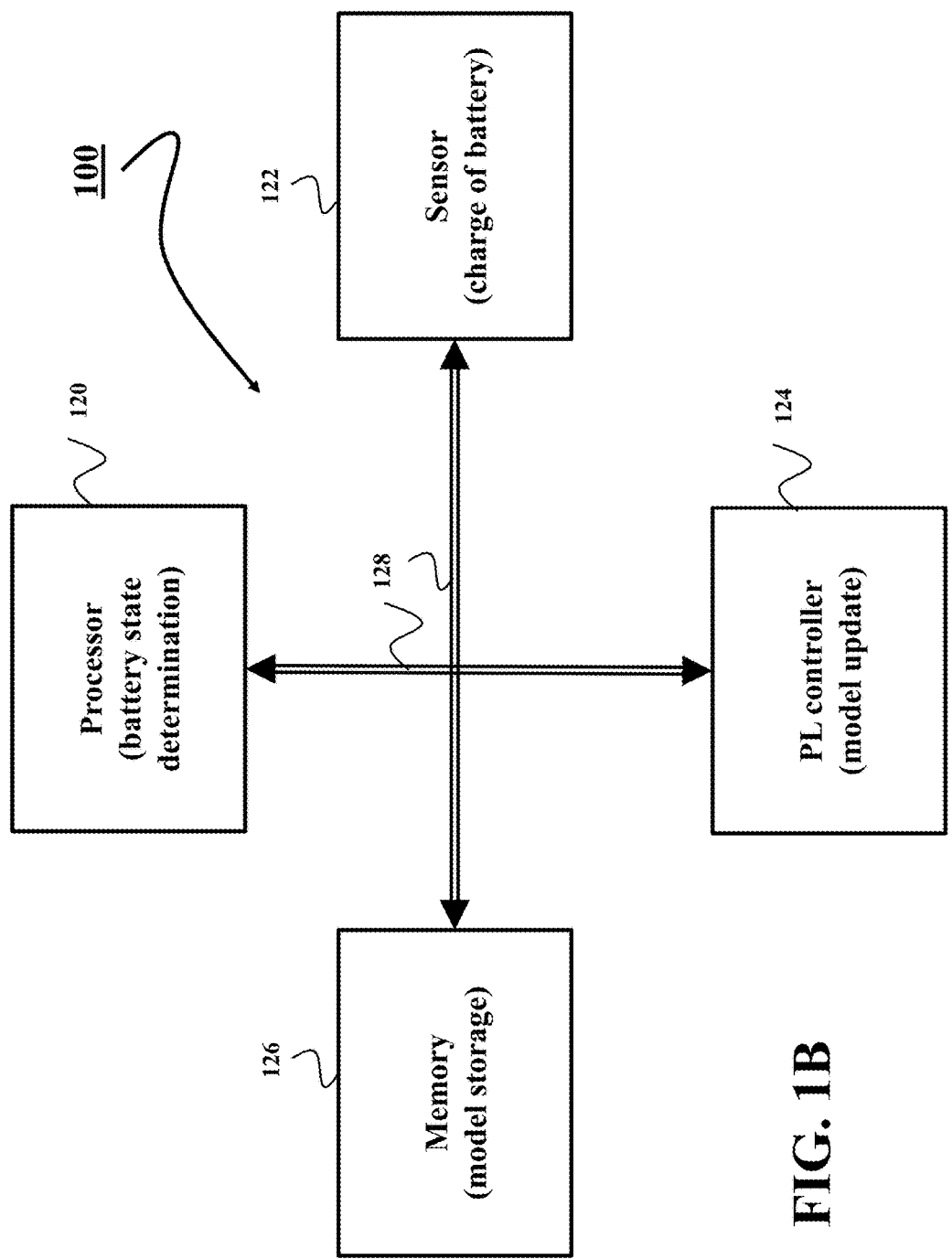
FIG. 1B is a block diagram of a system for estimating a state of charge of a battery according to one embodiment.

FIG. 1B shows a block diagram of a system 100 for estimating a state of charge of a battery according to one embodiment. The system includes a sensor 122 to measure physical quantities of the battery indicative of a charge of the battery, a memory 126 to store a model of the battery, and a parameter learning (PL) controller 124 to update at least one parameter of the model of the battery to reduce a difference between the measured charge of the battery and a charge of the battery estimated using the model of the battery. The system 100 also includes a processor 120 to determine the state of the battery using the updated model of the battery.

The processor 120 can be a single core processor, a multi-core processor, a computing cluster, or any number of other configurations. The memory 126 can include random access memory (RAM), read only memory (ROM), flash memory, or any other suitable memory systems. The processor 120 is connected through a bus 128 to the memory 126, the sensor 122, and, optionally, to one or more input and output devices.

The sensor 122 can be any type of sensor suitable for measuring any physical quantities of the battery indicative of a charge of the battery. For example, such physical quantities can be current passing through a circuit of the battery and/or a voltage on terminals of the battery. For example, the sensor 122 can include an ammeter and/or a voltmeter.

In some embodiments, the PL controller is an extremum-seeking (ES) controller 124 that iteratively perturbs the parameter of the model with a perturbation signal having a predetermined frequency until a termination condition is met. In alternative embodiments, the PL controller can use Gaussian Process and/or a reinforcement learning to update the model. The PL controller can be implemented using various types of processor, microprocessors, and/or various kinds of integrated circuits. For example, the ES controller 124 can be implemented using the processor 120.

Figure 1C:
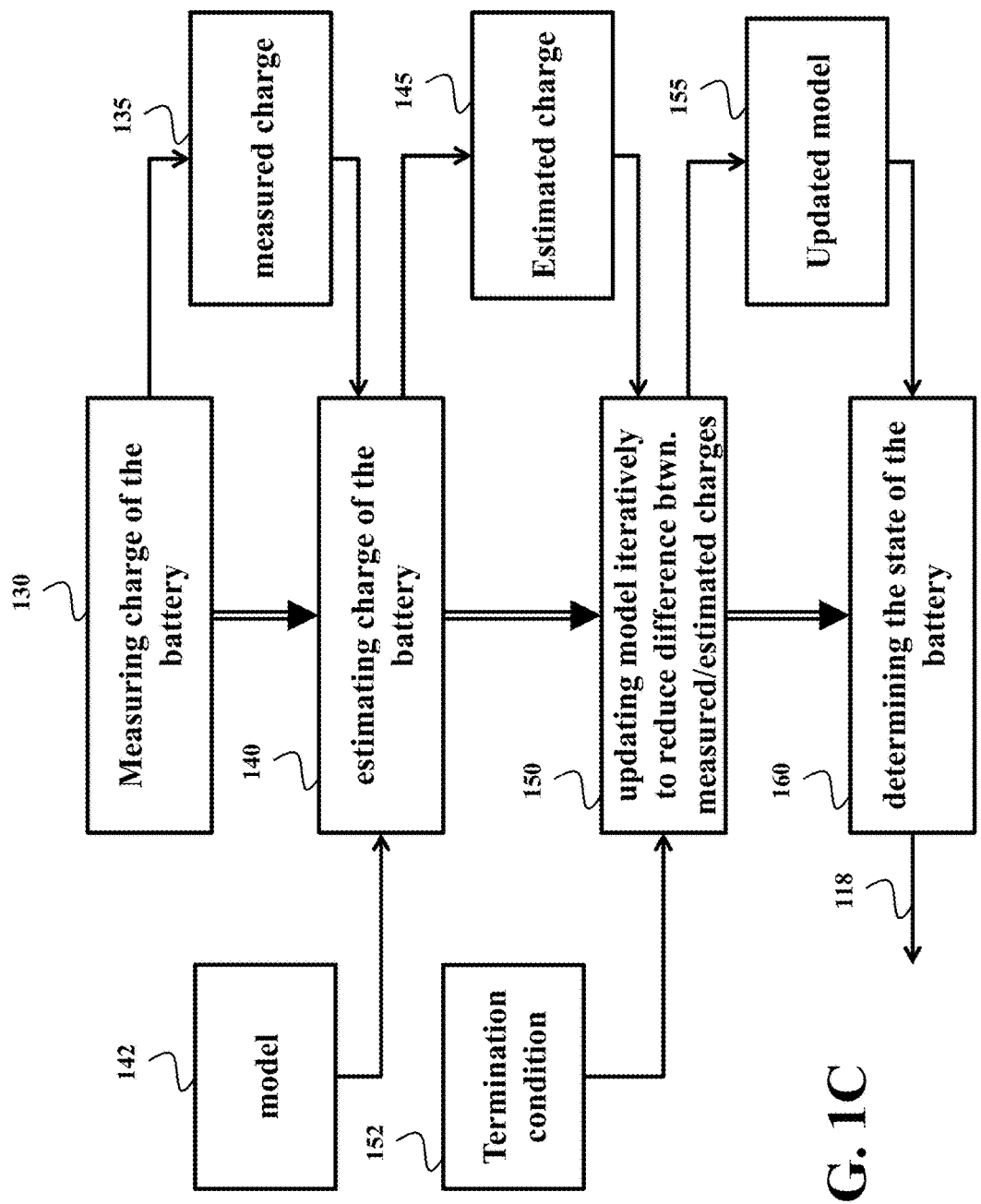
FIG. 1C is a block diagram of a method for estimating a state of a battery according to one embodiment.

FIG. 1C shows a block diagram of a method for estimating a state of a battery according to one embodiment. The method can be implemented using a system 100. For example, the steps of the method can be performed by a processor 120 operatively connected to the memory 126 and the sensor 122. This embodiment is based on realization that data driven method can update the parameters of the model of the battery based on comparison of the measured charge of battery and the charge of the battery estimated using the parameters of the model. In such a manner, the measured charge of the battery can provide the ground truth information that can be used for the model update over the lifespan of the battery.

To that end, the method measures 130, using a sensor 122, physical quantities of the battery indicative of a charge of the battery to produce a measured charge of the battery 135. The method also estimates 140 the physical quantities of the battery using a model 142 of the battery stored in a memory 126 to produce an estimated charge of the battery 145. Examples of the measured physical quantities of the battery includes current passing through the battery and voltage measured on the terminals of the battery.

The method updates 150 at least one parameter of the model of the battery to reduce a difference between the measured charge of the battery and the estimated charge of the battery to produce an updated model 155. In various embodiments, the parameters are leaned iteratively until a termination condition 152 is met. For example, in one embodiment the updating 150 uses a model-free extremum-seeking iteratively perturbing the parameter of the model with a perturbation signal having a predetermined frequency until a termination condition 152 is met. Examples of the termination condition include a number of iteration of the update 150 and/or a difference between the measured 135 and the estimated 145 charges.

After the model is updated, the method determines 160 the state 118 of the battery using the updated model 155. Examples of the model based method for estimating state of the battery includes, Kalman filters, control theory-based state observers, e.g., Lumbergue observers, sliding modes observers, and adaptive filters.

The system and the method of FIGS. 1B and 1C can adjust the parameters of the model to reflect the actual performance of the battery, which allows some embodiment to simplify the model of the battery. For example, different embodiments, additionally or alternatively to the usage of the models representing chemical processes inside the battery, use electric and kinetic models of the battery. Such a model simplification reduces computational requirements for the processor determining the state of the battery.

Figure 2A:
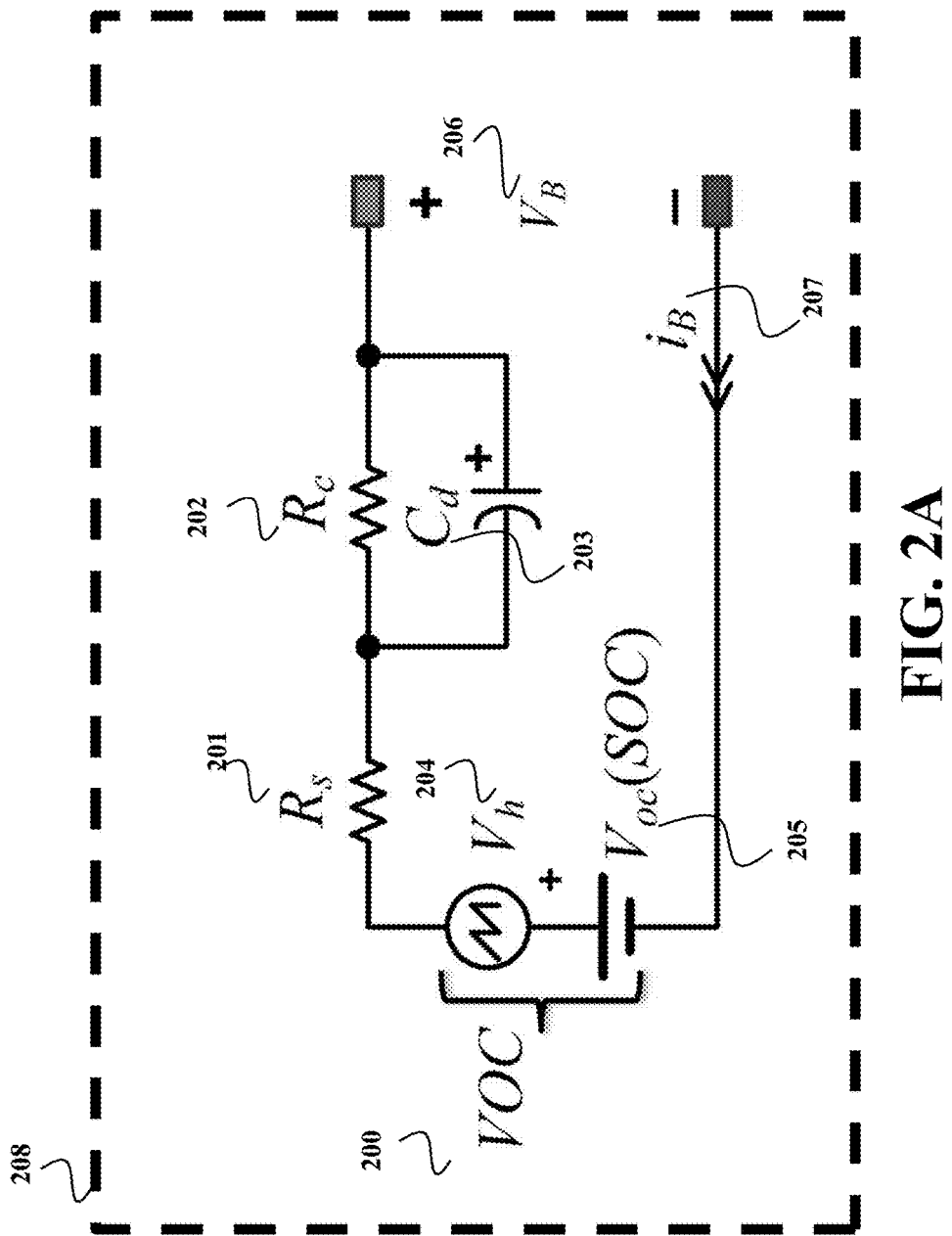
FIG. 2A is a diagram of an electrical circuit battery model used by some embodiments for state estimation.

FIG. 2A shows a diagram of an electrical circuit battery model 208 used by some embodiments for state estimation. Electrical circuit battery models are suitable for embedded applications due to their low complexity and the ability of characterizing the current-voltage (I-V) dynamics of battery cells. The voltage hysteresis effect between the charging and discharging widely exists in Li-ion batteries, especially for the LiFePO$_4$-type. One embodiment is realized that the first-order resistor-capacitor (RC) model with one-state hysteresis seems is the good choice for LiFePO$_4$ cells. Therefore, the first-order RC model 108 with a hysteresis is used in one embodiment to balance the model accuracy and its complexity.

The open-circuit voltage (OCV)$V_{oc}$ 100 includes two parts. The first part, $V_{oc}(SOC)$ 105, represents the equilibrium OCV as a function of the SOC. The second part $V_h$ 104 is the hysteresis voltage to capture the hysteresis behavior of the OCV curves. The RC circuit models the I-V characteristics and the transient response of the battery cell. The series resistance, $R_s$ 201 is used to describe the charge/discharge energy loss in the cell; the charge transfer resistance, $R_c$ 202 and double layer capacitance, $C_d$, 203 are used to characterize the charge transfer and short-term diffusion voltage, $V_d$ (the voltage along $C_d$) of the cell; $V_B$ 206 represents the terminal voltage of the cell.

In one embodiment, the following mathematical voltage hysteresis model is used $$\frac{\partial V_h}{\partial t} = -\rho(\eta i_B - \nu S_D)[V_{hmax} + \text{sign}(i_B)V_h], \quad (1)$$

where $\rho$ is the hysteresis parameter representing the convergence rate, $\eta$ is the Coulomb efficiency (assuming $\eta\beta 1$), $i_B$ is the instantaneous current applied to the battery, $\nu$ is the self-discharge multiplier for hysteresis expression, $S_D$ is the self-discharge rate, and $V_{hmax}$ is the maximum hysteresis voltage. The model (1) describes the dependency of the hysteresis voltage $V_h$ on the current, self-discharge, and hysteresis boundaries. The parameter $\rho$ can be selected to minimize the voltage error between the $V_{OC}$-SOC curves from simulation and experiments, respectively.

A discrete-time battery model, including the electrical circuit model 108 and the hysteresis model (1), can be written as follows $$X(k+1) = \begin{bmatrix} 1 & 0 & 0 \\ 0 & \gamma & 0 \\ 0 & 0 & H \end{bmatrix} X(k) + \begin{bmatrix} -\frac{\eta T_s}{C_{max}} & 0 \\ R_c(1-\gamma) & 0 \\ 0 & (H-1)\text{sign}(i_B) \end{bmatrix} \begin{bmatrix} i_B(k) \\ V_{hmax} \end{bmatrix} \quad (2)$$

$$y(k) = V_B(k) = V_{OC}(SOC(k)) - V_d(k) - R_s i_B(k) + V_h(k)$$

$$V_{OC}(SOC) = a_0 \exp(-a_1 SOC) + a_2 + a_3 SOC - a_4 SOC^2 + a_5 SOC^3,$$

where $X(k+1) = [SOC(k+1)V_d(k+1)V_h(k+1)]^T$ is the state, $y(k)$ is the measured output, $k$ is the time index, $C_{max}$ denotes the maximum capacity of the battery, $T_s$ is the sampling period, $$\gamma = \exp\left(\frac{-T_s}{\tau}\right)$$

with $\tau = R_c C_d$, $H(i_B) = \exp(-\rho|i_B|T_s)$, and $a_j$ for $0 \leq j \leq 5$ are the coefficients used to parameterize the $V_{OC}$-SOC curve. Coefficients $a_j$ for $0 \leq j \leq 5$ can be extracted by pulsed current tests or constant charge and discharge current test using a small current to minimally excite transient response of the battery cell.

Figure 2B:
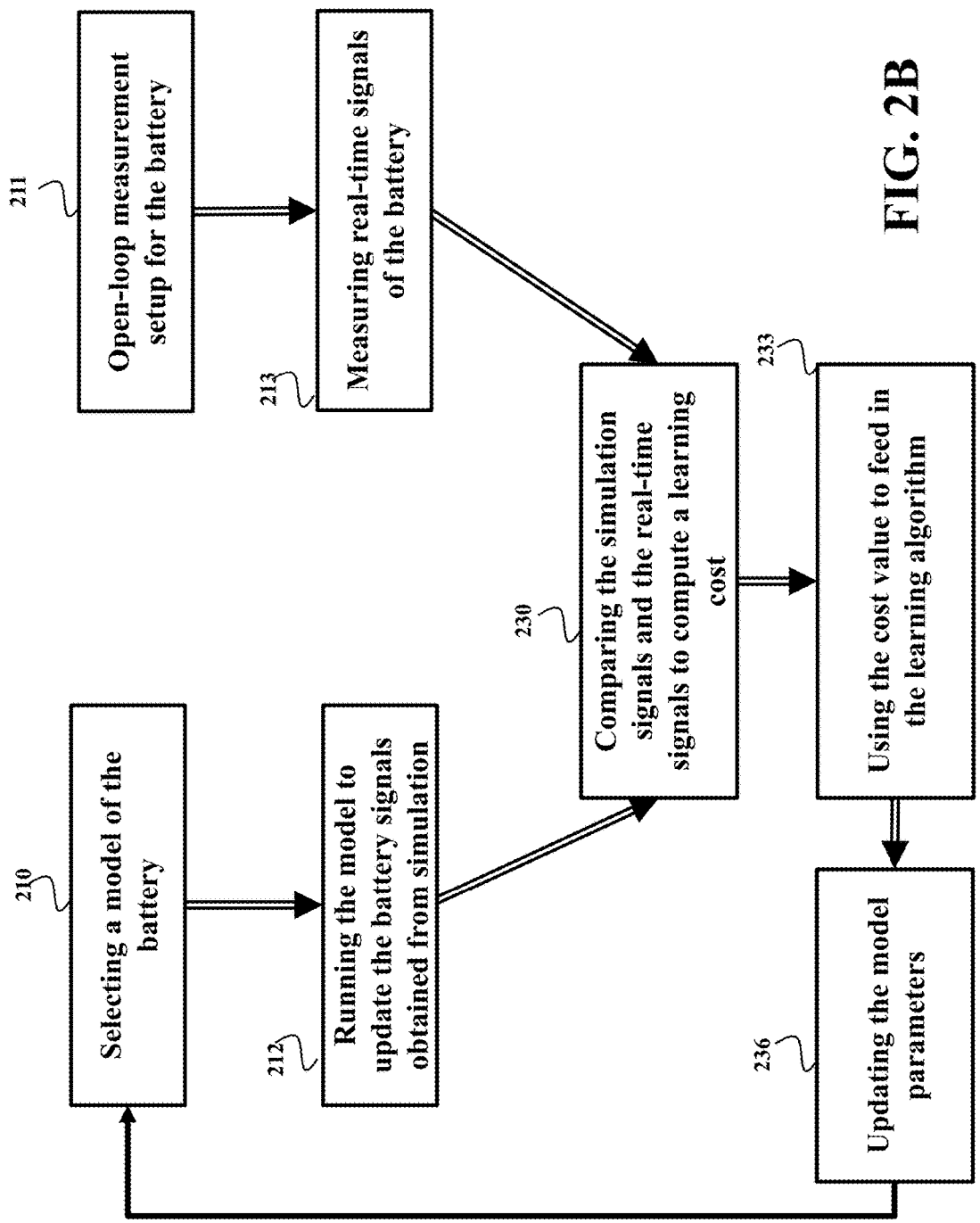
FIG. 2B is a block diagram of a learning-based parameter estimation of the model of the battery according to some embodiments.

FIG. 2B shows a block diagram of a learning-based parameter estimation of the model of the battery according to some embodiments. The steps of the method can be performed by a processor, e.g., a processor of the PL controller 124. The method selects 210 a model 210 of the battery. In one embodiment, the method selects a first-order resistor-capacitor (RC) model 208. In another embodiment, the method selects different models, such as a kinetic battery model or an electrochemical model. Next the real battery testbed need is set up for input-output signals measurements 211. In one embodiment the measured input to the battery testbed is the current and the measured output from the battery testbed is the voltage. Since this set put needs no feedback from output to input it is called open-loop measurement setup 211. Next, for the same input signal profile both the model estimation 212 and the testbed measurements 213 are run in parallel.

The obtained signals from the model estimation and from the real-time measurements are then compared to each other 230 to compute a learning cost function. The obtained value of the cost function is used 223 in a model-free learning identification method to update the estimation of the model parameters 236. Different embodiments use different learning identification methods. For example, one embodiment uses an extremum seeking as the learning identification method. Another embodiment uses Gaussian Process as the learning identification method. Yet another embodiment uses a reinforcement learning method to estimate the model parameters.

Figure 3A:
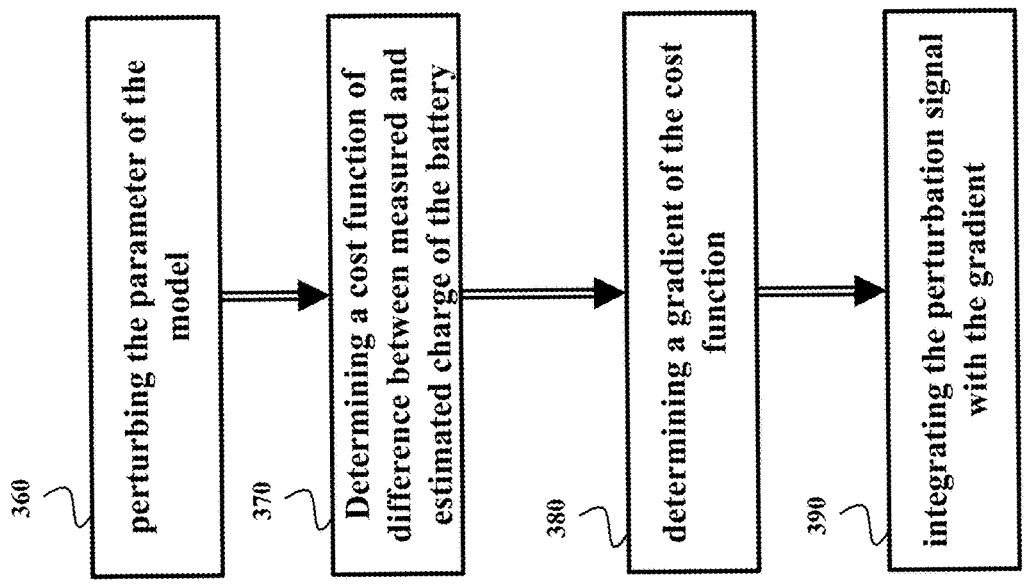
FIG. 3A is a block diagram of an extremum seeking (ES) method for updating the model of the battery according to one embodiment.

FIG. 3A shows a block diagram of an extremum seeking (ES) method for updating the model of the battery according to one embodiment. The extremum seeking iteratively perturbs the parameter of the model with a perturbation signal having a predetermined frequency until a termination condition is met. For example, an iteration of the extremum-seeking perturbs 360 the parameter of the model with the perturbation signal updated during a previous iteration of the extremum-seeking and determines 370, in response to the perturbing 360, a cost function of the difference between the measured charge of the battery and the estimated charge of the battery estimated using the model with perturbed parameter. For example, the perturbation signal can include a periodic signal of the predetermined frequency.

Next, the iteration determines 380 a gradient of the cost function by modifying the cost function with the perturbation signal, and integrates 390 the perturbation signal with the gradient of the cost function to update the perturbation signal for a next iteration of the extremum-seeking. For example, the gradient of the cost function is determined as a product of the cost function, the perturbation signal and a gain of the extremum-seeking. The iterations of the extremum-seeking can be repeated until the termination condition is met.

Figure 3B:
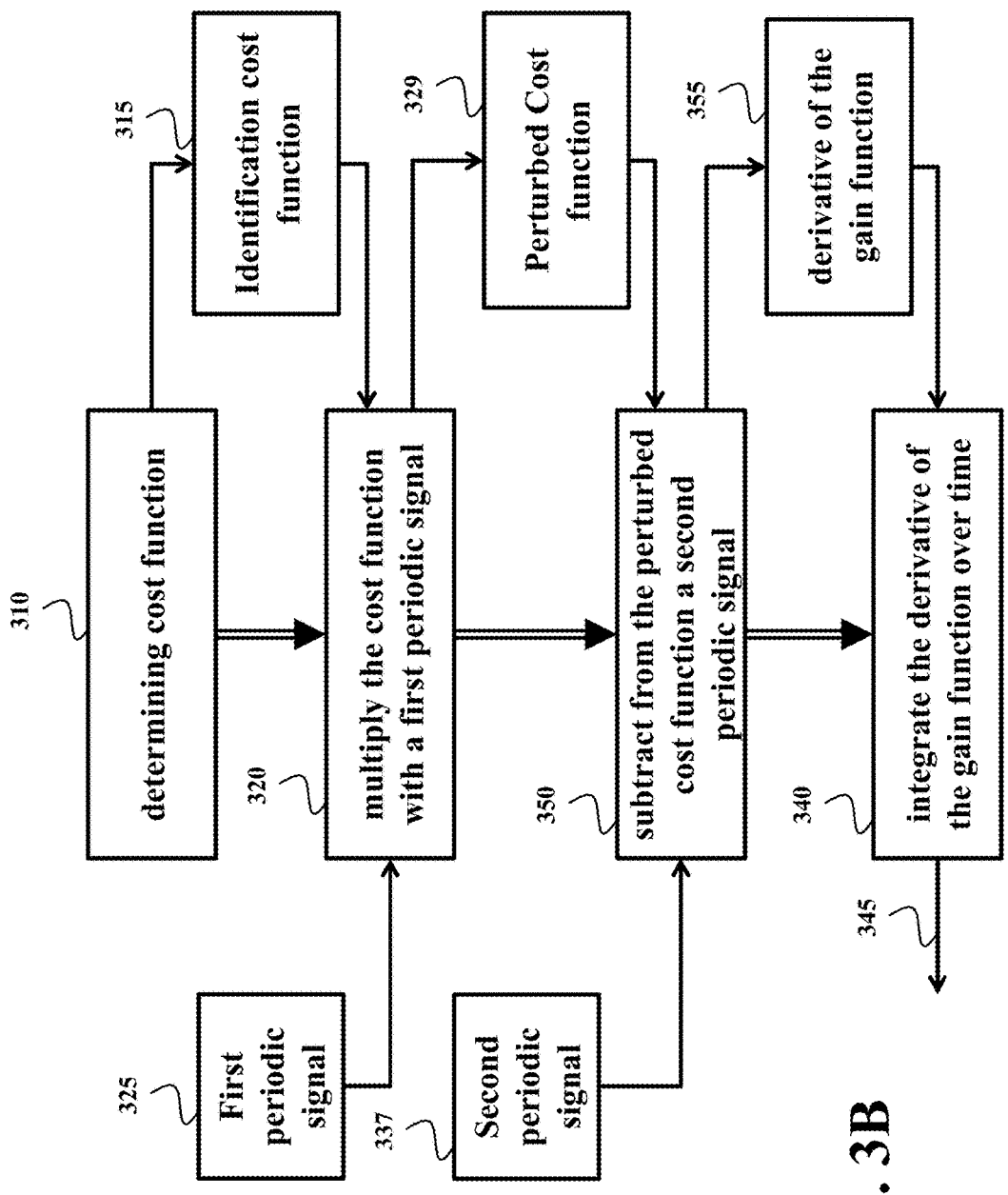
FIG. 3B is a block diagram of the ES method that uses identification cost function according to some embodiments.

FIG. 3B shows a block diagram of the extremum seeking method that uses identification cost function according to some embodiments. The method determines 310 an identification cost function 315 relating to the comparison of the estimated and measured charges. For example, the identification cost function can include a measure of the distance between the battery and the model of the battery, such measure can be quantified by a quadratic error between the signal measurements and the signals predictions modeled with the model. Such signals can be battery terminal voltage, battery power, etc. The extremum seeking multiplies 320 the cost function 315 with a first periodic signal 325 of time to produce a perturbed cost function 329 and subtracts 350 from the perturbed cost function 329 a second periodic signal 337 having a ninety degrees' quadrature phase shift with respect to a phase of the first periodic signal 325 to produce a derivative 355 of the gain function. The extremum seeking integrates the derivative of the gain function over time to produce the parameters values 345 as the function of time.

Figure 3C:
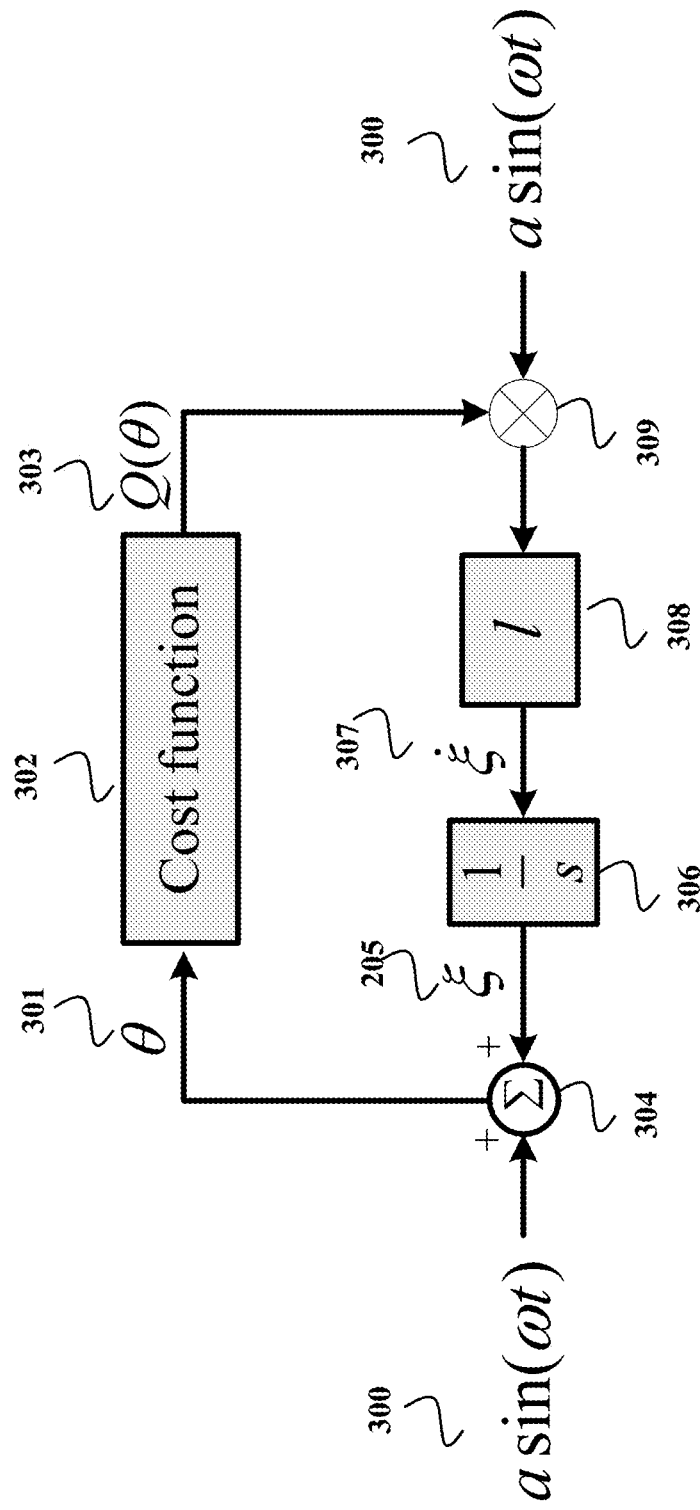
FIG. 3C is a schematic of an ES controller implementing the method of FIG. 3B.

FIG. 3C shows a schematic of an ES controller implementing the method of FIG. 3B. The ES controller injects a sinusoidal perturbation a sin ωt 300 into the system, resulting in an output of the cost function Q(θ) 303. This output Q(θ) 303 is subsequently multiplied by a sin ωt 300. The resulting signal after multiplying a gain 1, ξ̇ 307, is an estimate of the gradient of the cost function with respect to the cost function θ. The gradient estimate is then passed through an integrator 1/s 306 and added to the modulation signal a sin ωt 300.

The extremum-seeking is a model free learning method and therefore can be used for model update. Also, there can be a need to update multiple parameters of the model. For example, when the model of the battery is an electrical model 208 of a circuit formed by electrical components of the battery, the extremum-seeking can be a multivariable extremum-seeking updating concurrently parameters of a plurality of components of the electrical model.

Figure 3D:
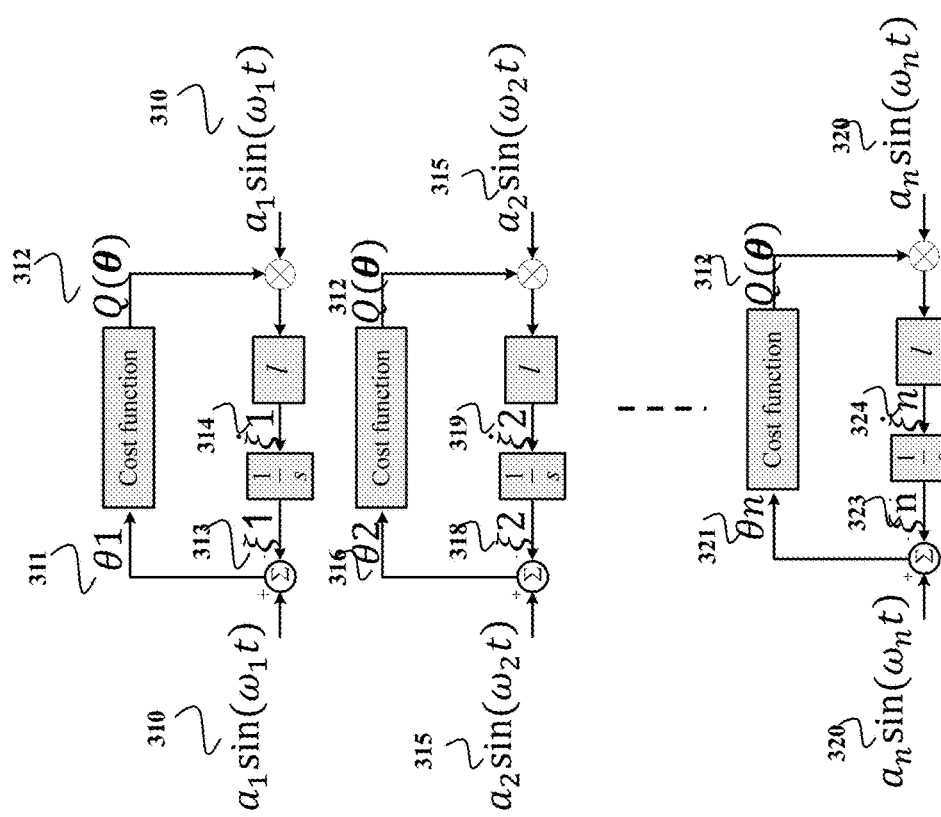
FIG. 3D is a schematic of a multi-parameter ES controller according to one embodiment.

FIG. 3D shows a schematic of a multi-parameter ES controller according to one embodiment. In this embodiment, the multi-parameter ES perturbs parameters in the set of parameters with corresponding perturbation signals having different frequencies to update the model stored in the memory. In some implementations, each of the different frequencies is greater than a frequency response of the battery. Additionally, or alternatively, in some implementations, the different frequencies of the perturbation signals satisfy a condition of convergence, such that a sum of a first frequency of a first perturbation signal and a second frequency of a second perturbation signal of the set is not equal to a third frequency of a third perturbation signal.

For example, when there are n parameters to estimate, the ES controller of FIG. 3C is duplicated n times, with n parameters θ, 311, 316, 321, n parameters ξ̂ᵢ 313, 318, 323, n perturbation signals 310, 315, 320, and one commune cost function 312, which is function of all the estimated parameters $\theta=(\theta_1, \ldots, \theta_n)^T$.

This multi-parameter ES can be described by equations as follows:

$$\dot{\xi}_i = a_i l \sin(\omega_i t) Q(\theta) \tag{3}$$

$$\theta_i = \xi_i + a_i \sin(\omega_i t), \tag{4}$$

where the perturbation frequencies $\omega_i$ s are such that $\omega_i \neq \omega_j$, $\omega_i + \omega_j \neq \omega_k$, i, j, k, $\in \{1, 2, n\}$, and $\omega_i > \omega^*$, with $\omega^*$ large enough to ensure the convergence. If the parameters $a_i$, $\omega_i$, and l are properly selected, the cost function output Q(θ) converges to an neighborhood of the optimal cost function value Q(θ*).

In order to implement the ES algorithm in the real-time embedded system, a discrete version of the ES algorithm is advantageous. An exemplar discrete version of the ES algorithm is:

$$\xi_i(k+1) = \xi_i(k) + a_i l \Delta T \sin(\omega_i k) Q(\theta(k)), \tag{5}$$

$$\theta_i(k+1) = \xi_i(k+1) + a_i \sin(\omega_i(k)), \tag{6}$$

where k is the time step and ΔT is the sampling time.

For example, when the model of the battery is an electrical model of a circuit formed by electrical components of the battery, the multi-parameter extremum-seeking can concurrently update the parameters of a plurality of components of the electrical model, i.e., the multi-parameter ES can identify the parameters of the battery model, i.e., $R_s$, $R_c$, $C_d$, and $C_{max}$ in (2).

Exemplar Embodiment

Figure 4:
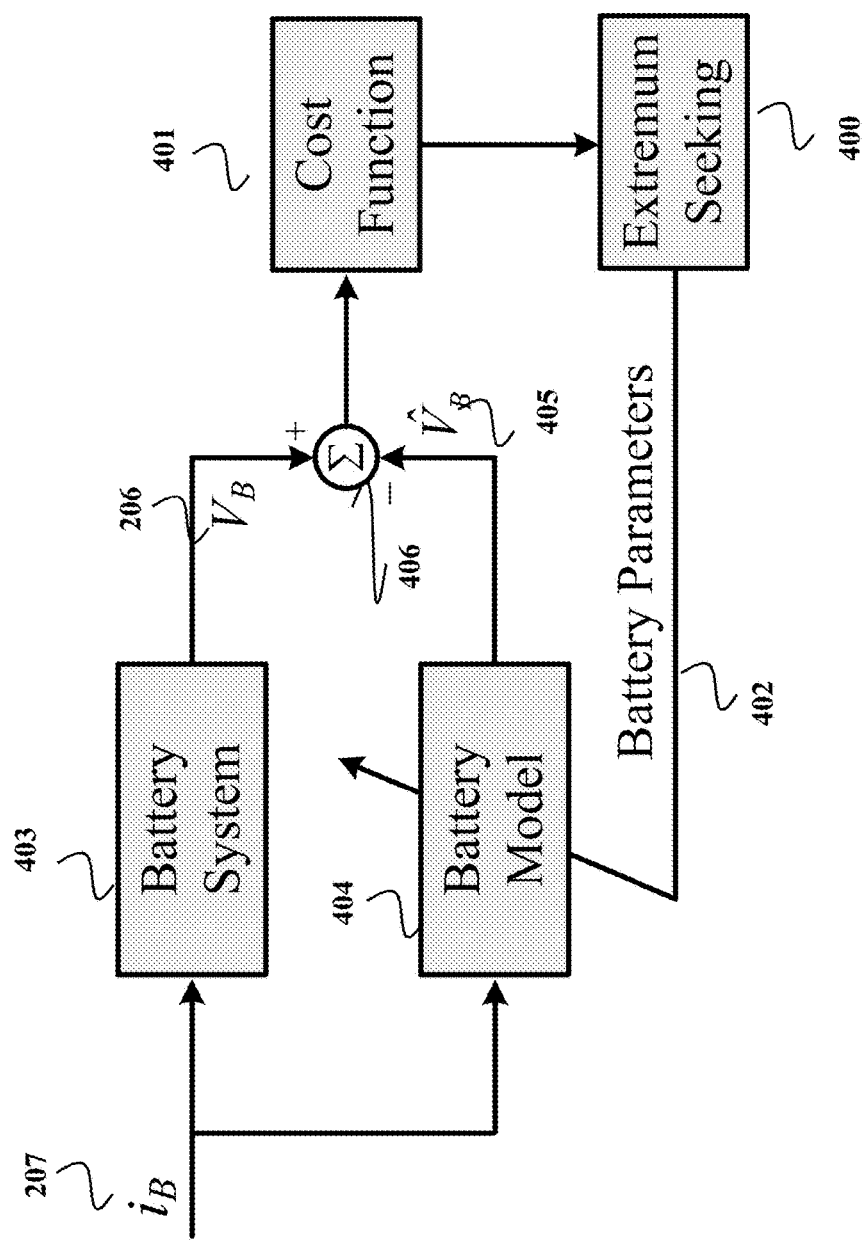
FIG. 4 is a block diagram of ES-based parameter identification method for lithium-ion battery according to one embodiment.

FIG. 4 shows a block diagram of ES-based parameter identification method for lithium-ion battery according to one embodiment. The model of the battery 404 includes an electrical model of a circuit formed by electrical components of the battery. For example, the model 404 can include the model 208 of FIG. 2A.

At each time step, a battery system 403 terminal voltage $V_B$ 206 is measured under a specific operating input current $i_B$ 207. The measured $V_B$ 206 is compared 406 with terminal voltage $\hat{V}_B$ 405 estimated using a battery model 404. For example, the terminal voltage $\hat{V}_B$ 405 is obtained using the battery model 404 based on the input current $i_B$ 207 using the estimated battery model parameters. The error of $V_B$ and $\hat{V}_B$ 406 is used to generate an identification cost function 401, which represents the convergence of the battery parameters

402. The battery parameters 402 is updated by the ES method 400 and used to generate a new value of the terminal voltage $\hat{V}_B$ 405 in the next time step. The parameter updating process proceeds until the termination condition is met, e.g., the cost function 401 becomes less than a threshold or the method reaches the maximum number of iterations.

For example, using the estimated parameters, the battery model 404 given in equation (2) can be written as $$S\hat{O}C(k+1) = S\hat{O}C(k) - \frac{\eta T_s}{\hat{C}_{max}} i_B(k), \quad (7)$$

$$\hat{V}_d(k+1) = \gamma(k)\hat{V}_d(k) + \hat{R}_c(k)(1-\gamma)i_B(k),$$

$$\hat{V}_h(k+1) = H\hat{V}_h(k) + (H-1)\text{sign}(i_B(k))V_{hmax}$$

$$\hat{V}_B(k) = V_{OC}(S\hat{O}C(k)) - \hat{V}_d(k) - \hat{R}_s(k)i_B(k) + \hat{V}_h(k),$$

where $\gamma(k) = \exp\left(\frac{-T_s}{\tau(k)}\right)$, and $\tau(k) = \hat{R}_c(k)\hat{C}_d(k)$.

In one embodiment, the following cost function 401 is used for each iteration:

$$Q(\theta(k)) = K_p \int_{t_0}^{T} [V_B(t) - \hat{V}_B(t)]^2 dt, \quad (8)$$

where $t_0$ and T are the times we begin and end taking into account the terminal voltage error during calculation of the cost function, respectively, and $K_p$ is a gain.

The battery model parameters are updated in the following form:

$$\hat{R}_s(k+1) = R_{s,no\ min\ al} + \delta\hat{R}_s(k),$$

$$\hat{R}_c(k+1) = R_{c,no\ min\ al} + \delta\hat{R}_c(k),$$

$$\hat{C}_d(k+1) = C_{d,no\ min\ al} + \delta\hat{C}_d(k),$$

$$\hat{C}_{max}(k+1) = C_{max,no\ min\ al} + \delta\hat{C}_{max}(k), \quad (9)$$

where $R_{s,no\ min\ al}$, $R_{c,no\ min\ al}$, $C_{d,no\ min\ al}$, and $C_{max,no\ min\ al}$ are the nominal initial values of the battery model parameters. Following equations (5) and (6), the variations of the identified battery model parameters 400 are given by $$\xi_1(k+1) = \xi_1(k) + a_1 l \Delta T \sin(\omega_1 k) Q(\theta(k)),$$

$$\delta\hat{R}_s(k) = \xi_1(k+1) + a_1 \sin(\omega_1(k)),$$

$$\xi_2(k+1) = \xi_2(k) + a_2 l \Delta T \sin(\omega_2 k) Q(\theta(k)),$$

$$\delta\hat{R}_c(k) = \xi_2(k+1) + a_2 \sin(\omega_2(k)),$$

$$\xi_3(k+1) = \xi_3(k) + a_3 l \Delta T \sin(\omega_3 k) Q(\theta(k)),$$

$$\delta\hat{C}_d(k) = \xi_3(k+1) + a_3 \sin(\omega_3(k)),$$

$$\xi_4(k+1) = \xi_4(k) + a_4 l \Delta T \sin(\omega_4 k) Q(\omega(k)),$$

$$\delta\hat{C}_{max}(k) = \xi_4(k+1) + a_4 \sin(\omega_4(k)), \quad (10)$$

where $a_1$, $a_2$, $a_3$, and $a_4$ are positive and $\omega_p + \omega_q \neq \omega_r$, p, q, r ∈ {1,2,3,4}, for p≠q≠r.

Figure 5A:
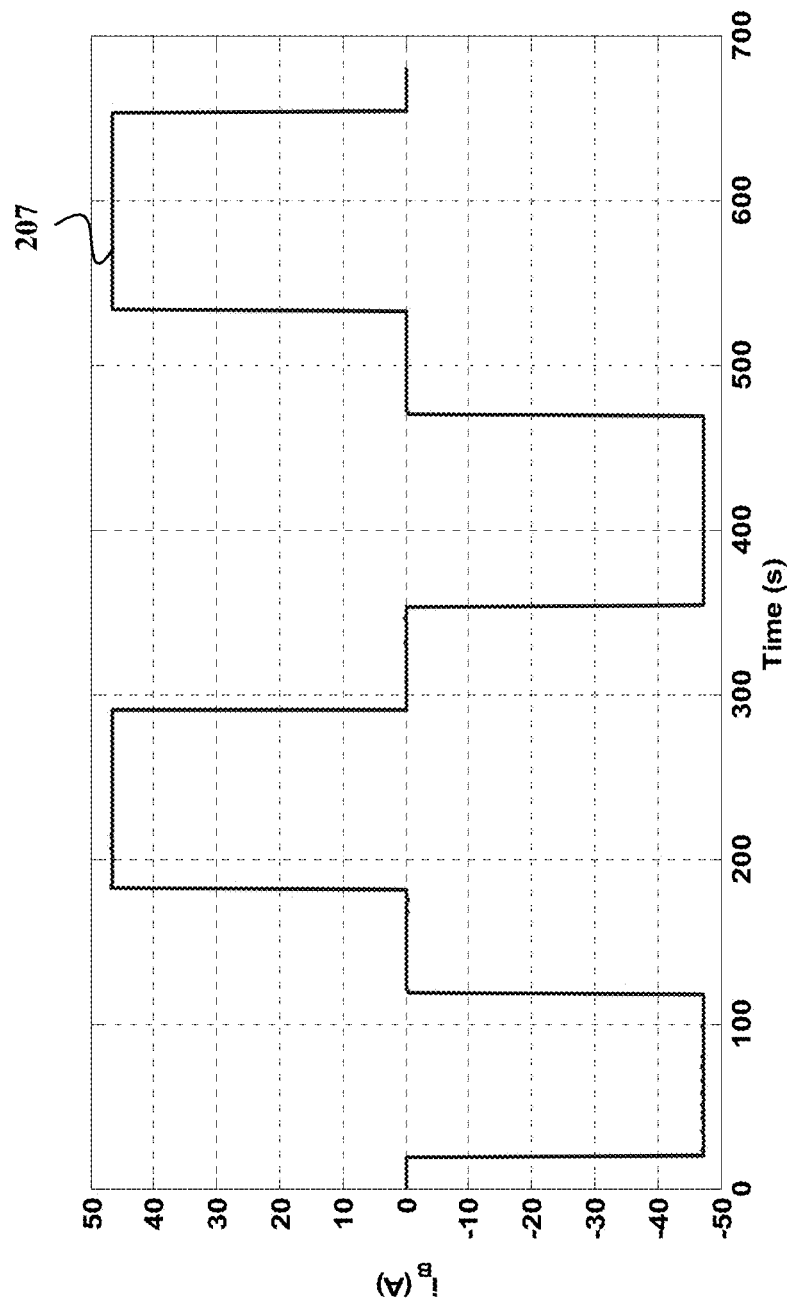
FIG. 5A is an example of an input signal to the battery system according to one embodiment.
Figure 5B:
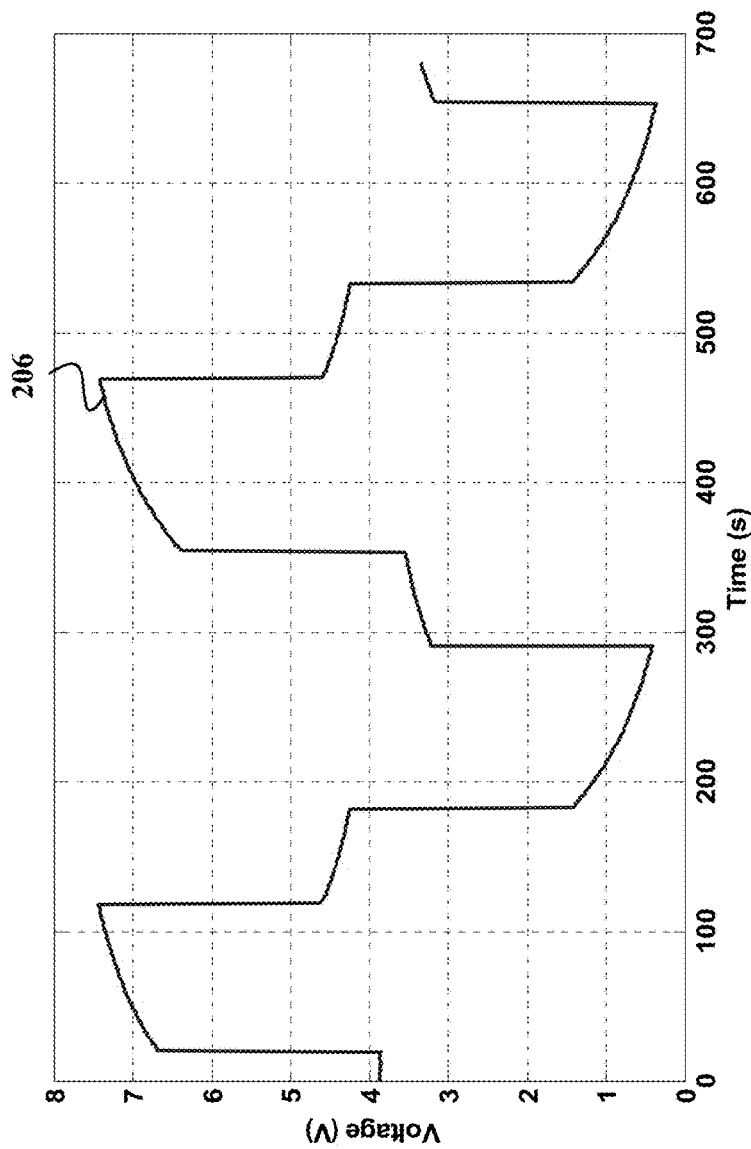
FIG. 5B is an example of an output measurement signal 206 associated with the input signal of FIG. 5A.
Figure 5C:
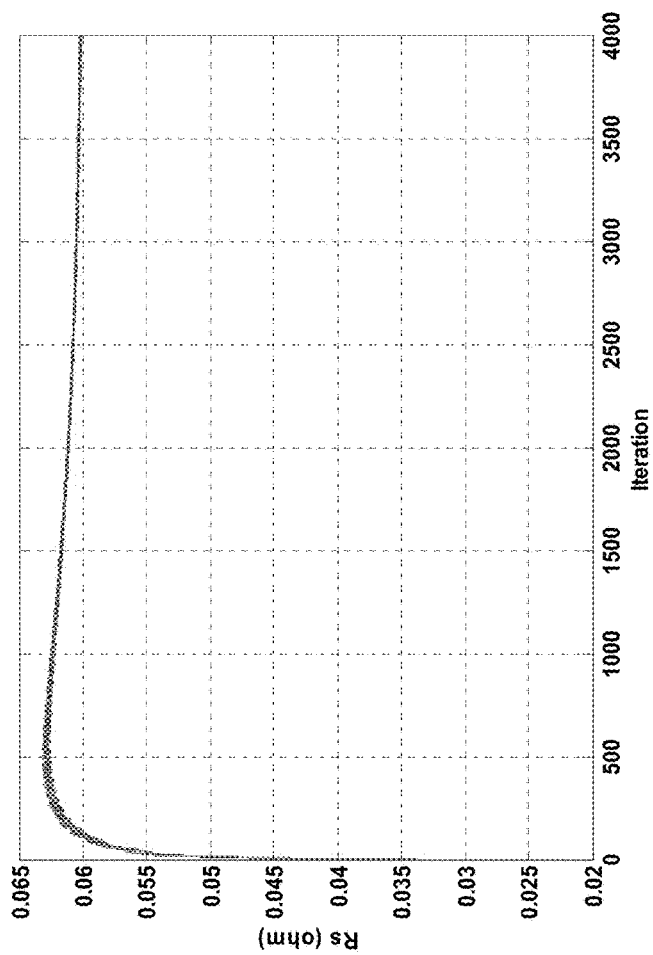
FIGS. 5C, 5D, 5E and 5F show graph illustrating different parameters of the model of the battery as a function of iteration of the ES method according to one embodiment.
Figure 5D:
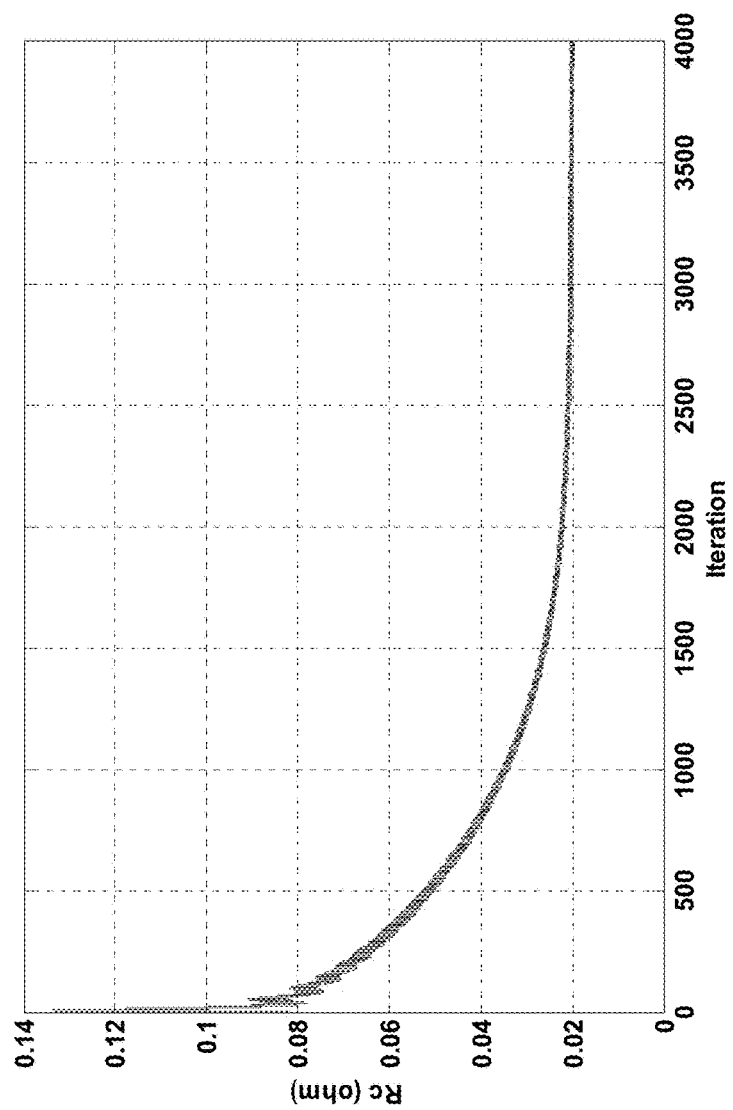
Figure 5E:
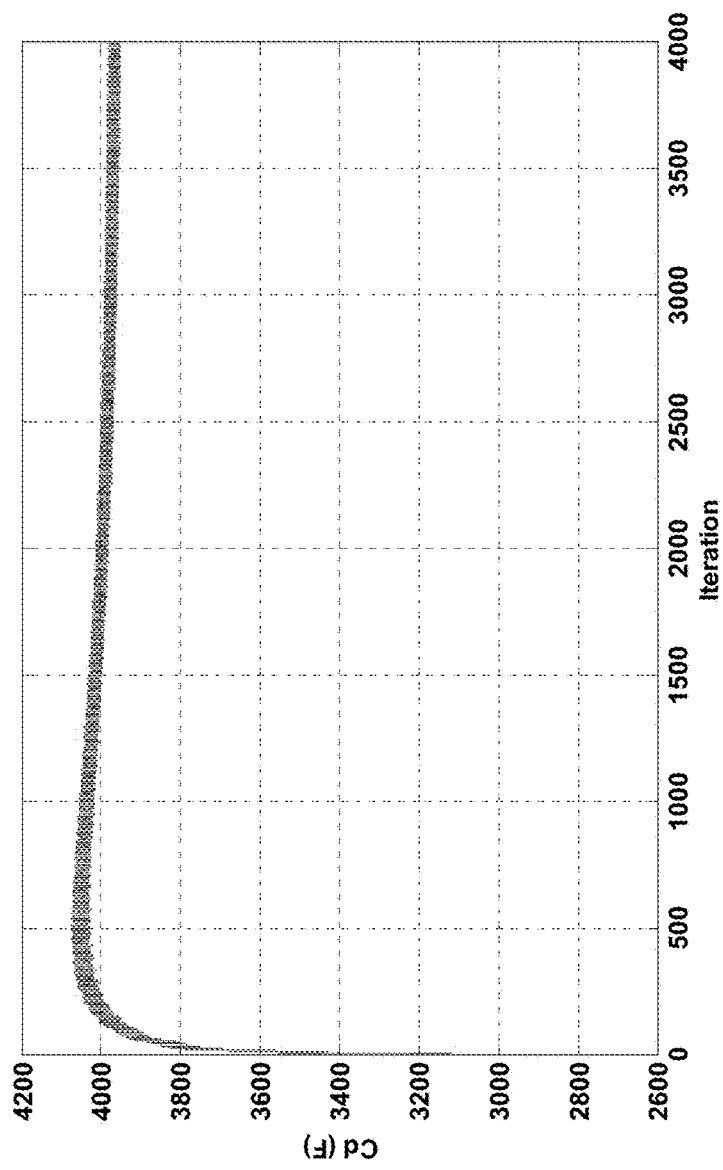
Figure 5F:
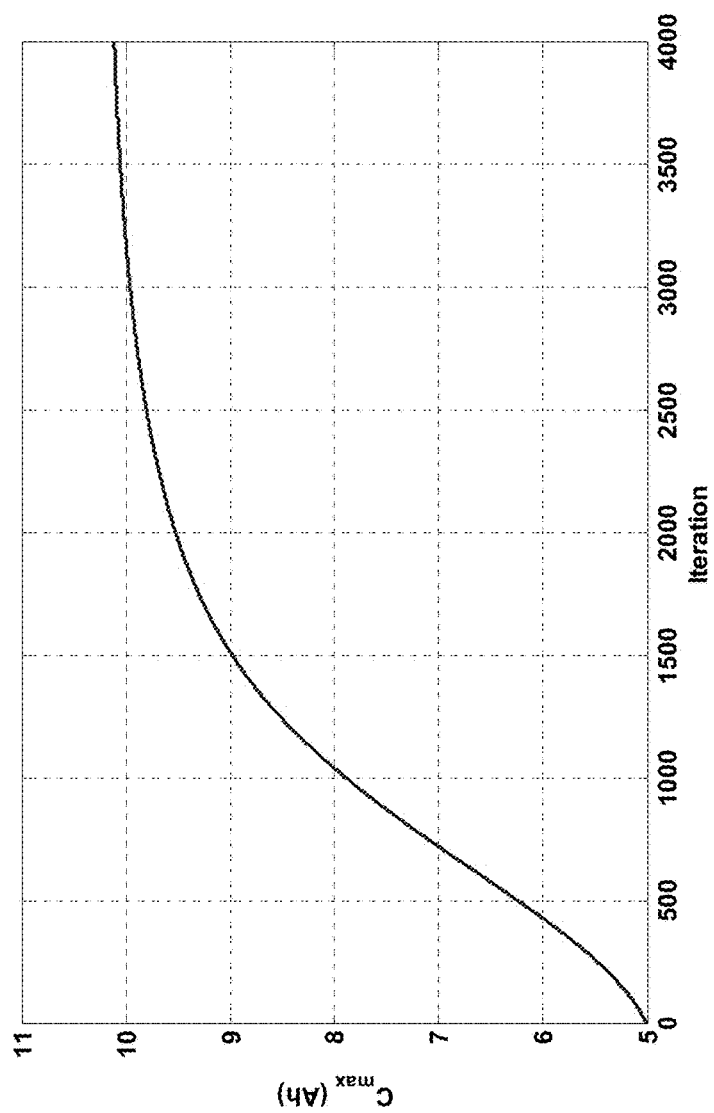
Figure 5G:
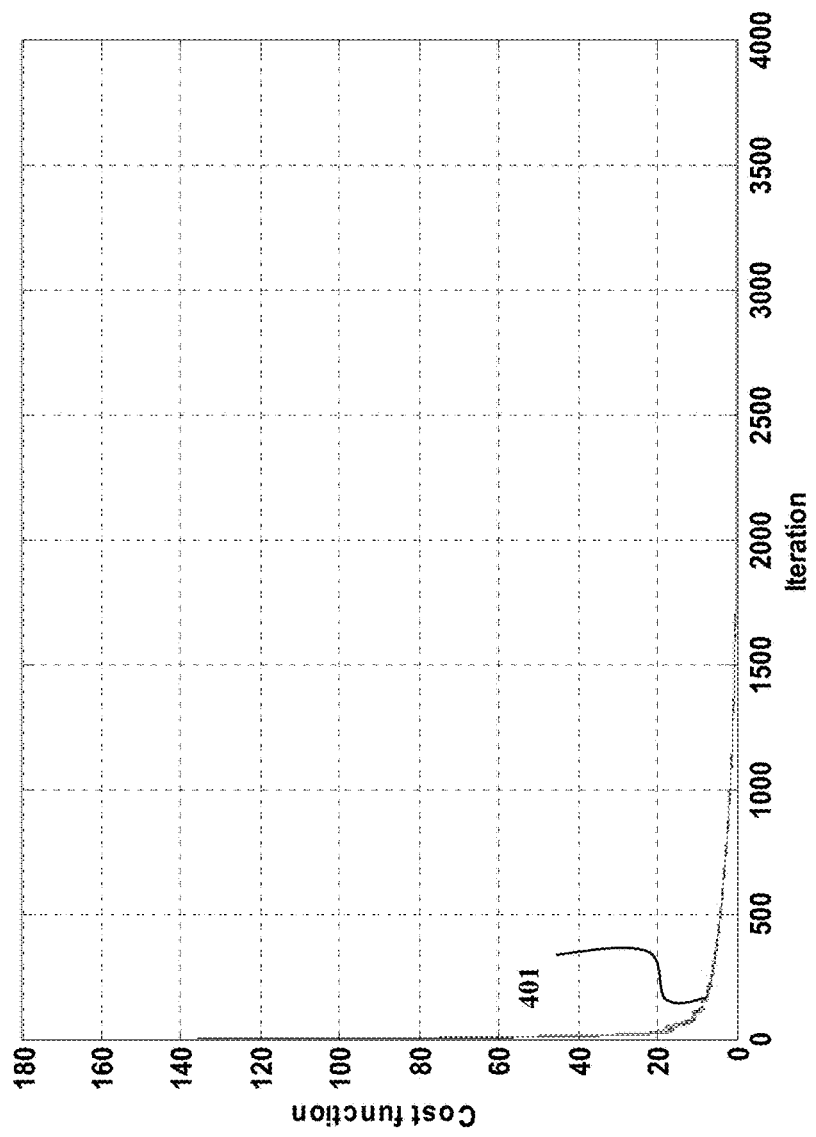
FIG. 5G is a graph illustrating changes in the cost function as a function of iteration of the ES method according to one embodiment.

FIG. 5A shows an example of an input signal 207 to the battery system. FIG. 5B shows output measurement signal 206 associated with the input signal 207 of FIG. 5A. FIG. 5G shows a graph illustrating changes in the cost function 401. FIGS. 5C, 5D, 5E and 5F show graph illustrating different parameters 402 of the 404 including the electric model 208, e.g., parameters $R_s$, $R_c$, $C_d$, and $C_{max}$, as a function of iteration of the ES method.

SOP Estimation

In various embodiments, the state of the battery includes one or combination of a state-of-charge (SOC) of the battery, a state-of-health (SOH) of the battery, a state-of-power (SOP) of the battery, and a depth-of-discharge (DOD) of the battery.

For example, to guarantee the safe and durable operation, in one embodiment, the working current and voltage of the lithium-ion is restricted in a range so that the battery power will be limited by the minimum value of the two restrictions given by $$SOP_{discharge} = \min[SOP_{discharge}^V\ SOP_{discharge}^I],$$

$$SOP_{charge} = \max[SOP_{charge}^V\ SOP_{charge}^I], \quad (11)$$

where $SOP_{discharge}$ and $SOP_{charge}$ are the maximum discharging and charging capabilities of the battery, respectively, $SOP_{discharge}^V$ and $SOP_{charge}^V$ are the battery SOPs under voltage limitation, $SOP_{discharge}^I$ and $SOP_{charge}^I$ are the battery SOPs under current limitation.

To predict the maximum power capability under the voltage limitation, one embodiment rewrites Equation (7) into $$S\hat{O}C(k+1) = S\hat{O}C(k) - \frac{\eta T_s}{C_{max}} i_B(k), \quad (12)$$

$$\hat{V}_d(k+1) = \gamma \hat{V}_d(k) + R_c(1-\gamma)i_B(k),$$

$$\hat{V}_h(k+1) = H\hat{V}_h(k) + (H-1)\text{sign}(i_B(k))V_{hmax},$$

$$\hat{i}_B(k+1) =$$

$$(V_{OC}(S\hat{O}C(k+1)) - \hat{V}_d(k+1) + \hat{V}_h(k+1) - V_B(k+1))/R_s,$$

where the battery model parameters $R_s$, $R_c$, $C_d$, and $C_{max}$ have been identified by the ES algorithm. The estimated current for the next time step $\hat{i}_B(k+1)$ can be obtained with a given $V_B(k+1)$.

According to Equation (12), the maximum discharging and charging current can be obtained by setting $V_B(k+1)$ to the minimum and maximum limiting value. Then, the battery SOP can be obtained by multiplying the maximum discharging and charging current with the limiting voltage. For example, one embodiment determines the SOP of the battery based on $$SOP_{discharge}^V(k+1) = V_{B\ min}\hat{i}_B(k+1)(V_{B\ min}),$$

$$SOP_{charge}^V(k+1) = V_{B\ min}\hat{i}_B(k+1)(V_{B\ max}), \quad (13)$$

where $SOP_{discharge}^V(k+1)$ and $SOP_{charge}^V(k+1)$ are the maximum discharging and charging capabilities for the next sampling interval under the voltage limitation, $V_{B\ max}$ and $V_{B\ min}$ are the maximum and minimum voltage allowed for the battery operation, respectively. With the updated $i_B(k)$ and $V_B(k)$, the embodiment can periodically predict the SOP of the battery for the next time step.

The maximum charging and discharging currents of the battery are also limited and can be considered in the SOP estimation. In order to predict the maximum power capability under the current limitation, Equation (7) is rewritten into $$S\hat{O}C(k+1) = S\hat{O}C(k) - \frac{\eta T_s}{C_{max}} i_B(k), \quad (14)$$

$$\hat{V}_d(k+1) = \gamma \hat{V}_d(k) + R_c(1-\gamma)i_B(k),$$

-continued $$\hat{V}_h(k+1) = H\hat{V}_h(k) + (H-1)\text{sign}(i_B(k))V_{hmax},$$

$$\hat{V}_B(k+1) = V_{OC}(S\hat{O}C(k+1)) - \hat{V}_d(k+1) - R_s i_B(k+1) + \hat{V}_h(k+1),$$

where the battery model parameters $R_s$, $R_c$, $C_d$, and $C_{max}$ have been identified by the ES method. The estimated voltage for the next time step $\hat{V}_B(k+1)$ can be obtained with a given $i_B(k+1)$.

According to Equation (14), by setting $i_B(k+1)$ to the maximum discharging current $I_{max}$ or maximum charging current $I_{min}$, $\hat{V}_B(k+1)$ can be calculated. Then, the battery SOP can be expressed as $$SOP_{discharge}{}^I(k+1) = I_{B\ max}\hat{V}_B(k+1)(I_{B\ max}),$$

$$SOP_{charge}{}^I(k+1) = I_{B\ min}\hat{V}_B(k+1)(I_{B\ min}), \quad (13)$$

where $SOP_{discharge}{}^I(k+1)$ and $SOP_{charge}{}^I(k+1)$ are the maximum discharging and charging capabilities for the next sampling interval under the current limitation, $I_{max}$ and $I_{min}$ the maximum discharging and charging currents allowed for the battery operation, respectively. With the updated $i_B(k)$ and $V_B(k)$, the embodiment above can periodically update the SOP of the battery under the current limitation for the next time step.

Figure 6A:
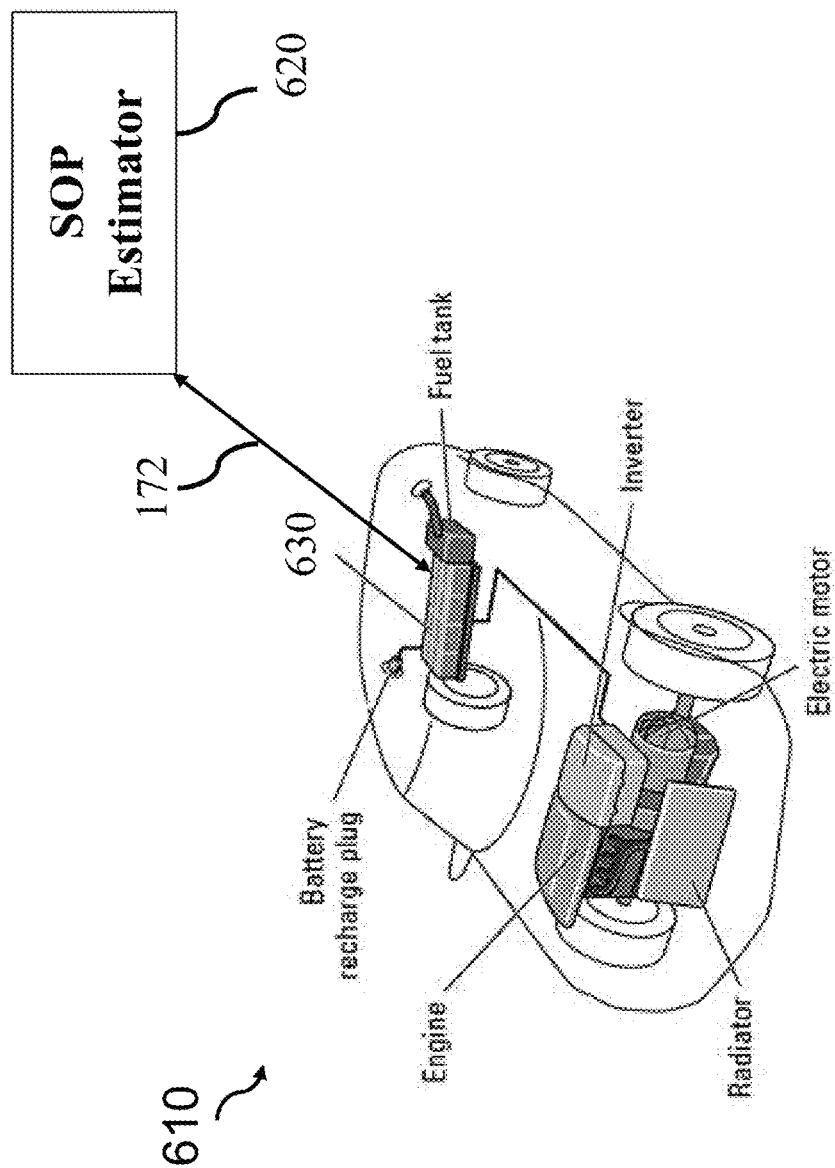
FIG. 6A is an exemplar determination of the state of the battery 630 installed at an electric vehicle according to some embodiments.

FIG. 6A shows an exemplar determination of the SOP of the battery 630 installed at an electric vehicle 610 according to some embodiments. For example, some embodiments enable a driver of the vehicle 610 to manage the battery system to ensure enough power is available. In general, a separate device 620, e.g., including the processor and memory, is connected to the battery 630 and/or the sensors of the battery 630 via connectors 640 can perform the necessary measurements and estimates the SoC. For example, the device 620 can include the system 100. It is also contemplated the separate device 620 can include a battery management application, among other things. Also, in different embodiments, the device 620 determines one or combination of a state-of-charge (SOC) of the battery, a state-of-health (SOH) of the battery, a state-of-power (SOP) of the battery, and a depth-of-discharge (DOD) of the battery.

Figure 6B:
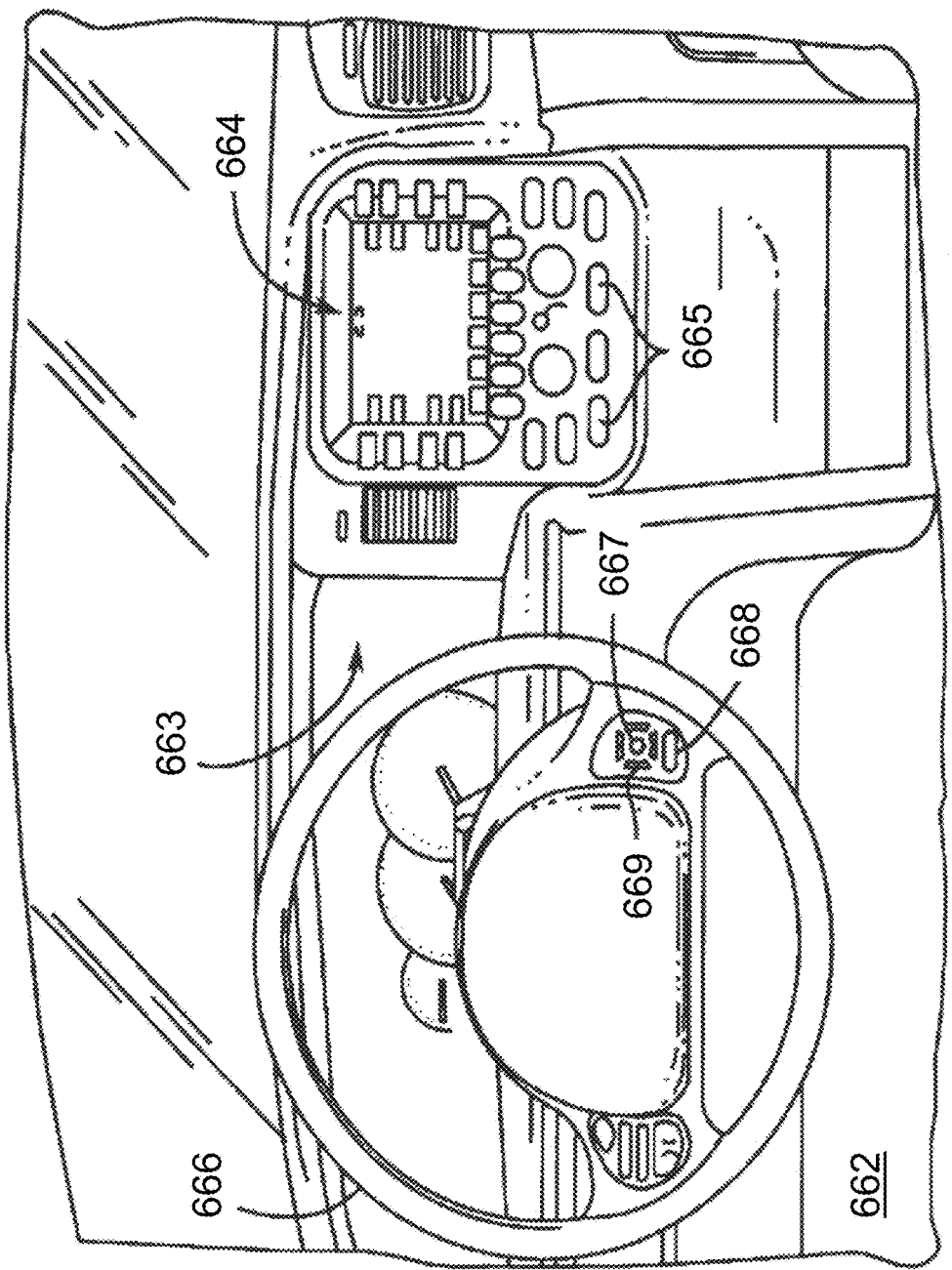
FIG. 6B shows an exemplar instrumental panel of the vehicle of FIG. 6A.

FIG. 6B shows an exemplar instrumental panel 662 of the vehicle 610. The instrumental panel 662 can include one or several displays 663 and 664 for displaying the results of the SOP estimation to the driver of the vehicle. The SOP estimation can be shown on the displays 663, 664 automatically or when the critical level of the SOP is reached. Additionally, or alternatively, the SOP can be displayed on demand, e.g., via controls 665 and/or controls 667, 668 and/or 669 located on a steering wheel 666. It is contemplated the display maybe a wireless device separate from the instrumental panel 662.

Figure 7:
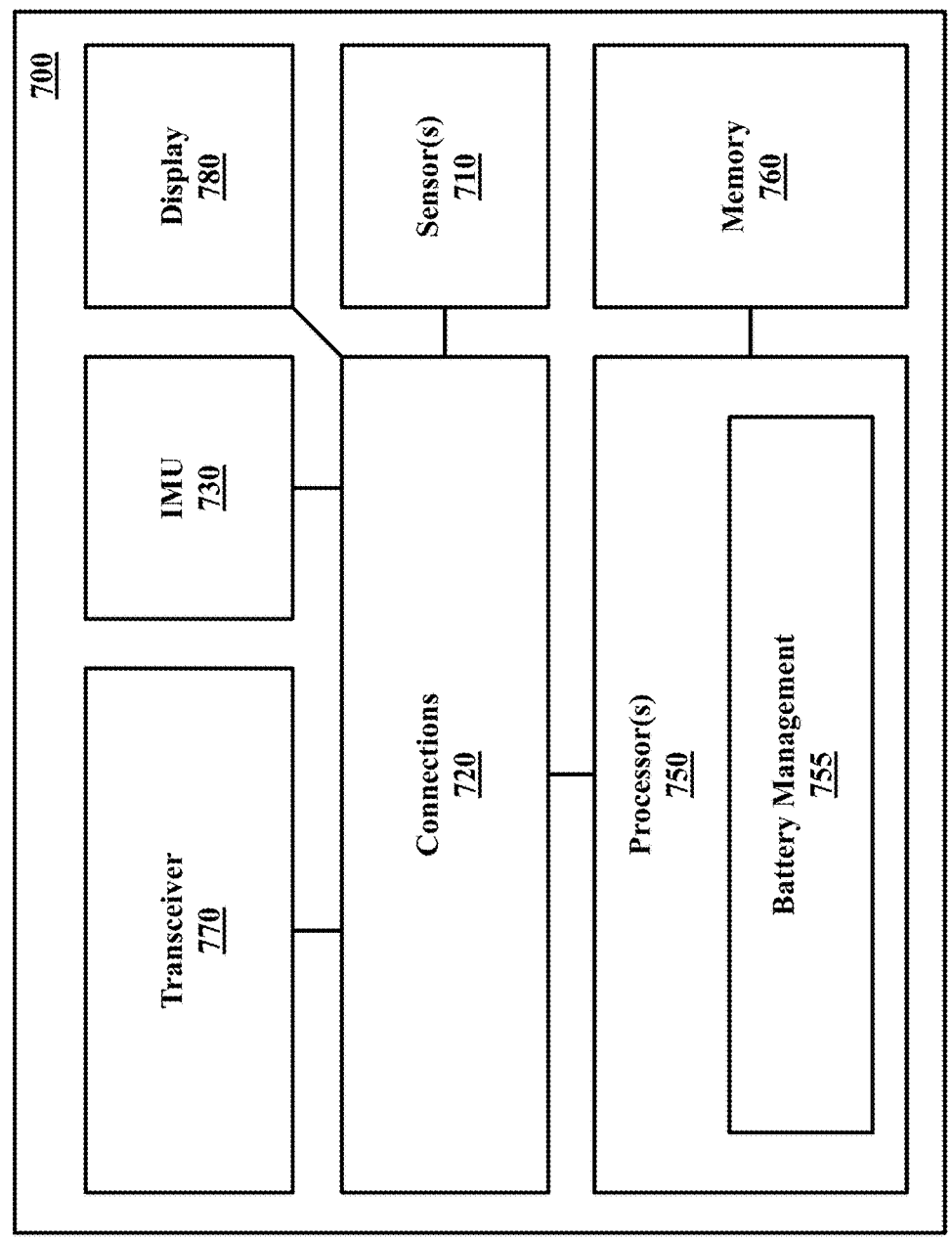
FIG. 7 shows a block diagram of an exemplary system configured for determining the state of the battery according to some embodiments.

FIG. 7 shows a block diagram of an exemplary system 700 configured for determining the state of the battery according to some embodiments of the disclosure. The system 700 can be implemented integral with the battery or machinery having the battery. Additionally, or alternatively, the system 700 can be communicatively connected to the sensors measuring physical quantities of the battery.

The system 700 can include one or combination of sensors 710, an inertial measurement unit (IMU) 730, a processor 750, a memory 760, a transceiver 770, and a display/screen 780, which can be operatively coupled to other components through connections 720. The connections 720 can comprise buses, lines, fibers, links or combination thereof.

The transceiver 770 can, for example, include a transmitter enabled to transmit one or more signals over one or more types of wireless communication networks and a receiver to receive one or more signals transmitted over the one or more types of wireless communication networks. The transceiver 770 can permit communication with wireless networks based on a variety of technologies such as, but not limited to, femtocells, Wi-Fi networks or Wireless Local Area Networks (WLANs), which may be based on the IEEE 802.11 family of standards, Wireless Personal Area Networks (WPANS) such Bluetooth, Near Field Communication (NFC), networks based on the IEEE 802.15x family of standards, and/or Wireless Wide Area Networks (WWANs) such as LTE, WiMAX, etc. The system 700 can also include one or more ports for communicating over wired networks.

In some embodiments, the system 700 can comprise sensors for measuring physical quantities of the battery, which are hereinafter referred to as "sensor 710". For example, the sensor 710 can include a voltmeter for measuring voltage of the battery, an ammeter for measuring current of the battery, and a thermometer for measuring temperature of the battery.

The system 700 can also include a screen or display 780 rendering information about the state of the battery. In some embodiments, the display 780 can also be used to display measurements from the sensor 710. In some embodiments, the display 780 can include and/or be housed with a touchscreen to permit users to input data via some combination of virtual keyboards, icons, menus, or other GUIs, user gestures and/or input devices such as styli and other writing implements. In some embodiments, the display 480 can be implemented using a liquid crystal display (LCD) display or a light emitting diode (LED) display, such as an organic LED (OLED) display. In other embodiments, the display 480 can be a wearable display.

In some embodiments, the result of the state estimation can be rendered on the display 780 or submitted to different applications that can be internal or external to the system 700. For example, a battery management application 755 running on the processor 750 can implement and execute various battery management methods.

Exemplary system 700 can also be modified in various ways in a manner consistent with the disclosure, such as, by adding, combining, or omitting one or more of the functional blocks shown. For example, in some configurations, the system 700 does not include the IMU 730 or the transceiver 770.

The processor 750 can be implemented using a combination of hardware, firmware, and software. The processor 750 can represent one or more circuits configurable to perform at least a portion of a computing procedure or process related to sensor fusion and/or methods for further processing the fused measurements. The processor 750 retrieves instructions and/or data from memory 760. The processor 750 can be implemented using one or more application specific integrated circuits (ASICs), central and/or graphical processing units (CPUs and/or GPUs), digital signal processors (DSPs), digital signal processing devices (DSPDs), programmable logic devices (PLDs), field programmable gate arrays (FPGAs), controllers, micro-controllers, microprocessors, embedded processor cores, electronic devices, other electronic units designed to perform the functions described herein, or a combination thereof.

The memory 760 can be implemented within the processor 750 and/or external to the processor 750. As used herein the term "memory" refers to any type of long term, short term, volatile, nonvolatile, or other memory and is not to be limited to any particular type of memory or number of memories, or type of physical media upon which memory is stored. In some embodiments, the memory 760 holds program codes that facilitate state estimation, and other tasks performed by the processor 750. For example, the memory 760 can store the measurements of the sensors as well as the estimation determined during the training stage. For example, the memory 760 can include a non-transitory computer readable storage medium embodied thereon a program executable by a processor for performing methods of one or different various embodiments disclosed herein.

In general, the memory 760 can represent any data storage mechanism. The memory 760 can include, for example, a primary memory and/or a secondary memory. The primary memory can include, for example, a random access memory, read only memory, etc. While illustrated in FIG. 7 as being separate from the processors 750, it should be understood that all or part of a primary memory can be provided within or otherwise co-located and/or coupled to the processors 750.

Secondary memory can include, for example, the same or similar type of memory as primary memory and/or one or more data storage devices or systems, such as, for example, flash/USB memory drives, memory card drives, disk drives, optical disc drives, tape drives, solid state drives, hybrid drives etc. In certain implementations, secondary memory can be operatively receptive of, or otherwise configurable to a non-transitory computer-readable medium in a removable media drive (not shown). In some embodiments, the non-transitory computer readable medium forms part of the memory 760 and/or the processor 750.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format. The processor can be connected to memory, transceiver, and input/output interfaces as known in the art.

Although the invention has been described with reference to certain preferred embodiments, it is to be understood that various other adaptations and modifications can be made within the spirit and scope of the invention. Therefore, it is the object of the append claims to cover all such variations and modifications as come within the true spirit and scope of the invention.

The invention claimed is:

1. A method for estimating a state of a battery, comprising:
   determining, using a sensor, physical quantities including a current passing through a circuit of the battery, a voltage on terminals of the battery, or both, indicative of a charge of the battery to produce a measured charge of the battery;
   estimating the physical quantities of the battery using a model of the battery stored in a memory to produce an estimated charge of the battery;
   updating at least one parameter of the model including a value of resistance (R) or a value of capacitance (C) of the battery to reduce a difference between the measured charge of the battery and the estimated charge of the battery, wherein the updating uses a model-free extremum-seeking iteratively perturbing the at least one parameter of the model with a perturbation signal having a predetermined frequency until a termination condition is met; and
   determining the state of the battery using the updated model of the battery, wherein steps of the method are performed by a processor operatively connected to the memory and the sensor.

2. The method of claim 1, wherein the physical quantities of the battery include one or combination of the voltage of the battery and the current of the battery, such that the measured charge of the battery includes one or combination of the measured voltage of the battery and the measured current of the battery, and wherein the estimated charge of the battery includes one or combination of the estimated voltage of the battery and the estimated current of the battery.

3. The method of claim 1, wherein the state of the battery includes one or combination of a state-of-charge (SOC) of the battery, a state-of-health (SOH) of the battery, a state-of-power (SOP) of the battery, and a depth-of-discharge (DOD) of the battery.

4. The method of claim 1, wherein the model of the battery is an electrical model of the circuit formed by electrical components of the battery.

5. The method of claim 1, wherein the extremum-seeking comprises:
   multiplying a cost function of the difference between the measured charge of the battery and the estimated charge of the battery with a first periodic signal of time to produce a perturbed cost function;
   subtracting from the perturbed cost function a second periodic signal having a ninety degrees quadrature phase shift with respect to a phase of the first periodic signal to produce a derivative of a gain function; and
   integrating the derivative of the gain function over time to update the parameter of the model as the function of time.

6. The method of claim 1, wherein the extremum-seeking is a multivariable extremum-seeking updating concurrently multiple parameters of the model.

7. The method of claim 1, wherein the model of the battery is an electrical model of a circuit formed by electrical components of the battery, and wherein the extremum-seeking is a multi-parameter extremum-seeking updating concurrently parameters of a plurality of electrical components of the electrical model.

8. The method of claim 1, wherein a current iteration of the extremum-seeking comprises:
   perturbing the at least one parameter of the model with the perturbation signal updated during a previous iteration of the extremum-seeking;
   determining, in response to perturbing the at least one parameter of the model with the perturbation signal, a cost function of the difference between the measured charge of the battery and the estimated charge of the battery estimated using the model with perturbed at least one parameter;
   determining a gradient of the cost function by modifying the cost function with the perturbation signal; and
   mathematically integrating the perturbation signal with the gradient of the cost function to update the perturbation signal for a next iteration of the extremum-seeking.

9. The method of claim 8, wherein the gradient of the cost function is determined as a product of the cost function, the perturbation signal and a gain of the extremum-seeking.

10. The method of claim 1, wherein the extremum-seeking is a multi-parameter extremum-seeking jointly updating a set of parameters of the model, further comprising:
perturbing parameters in the set of parameters with corresponding perturbation signals having different frequencies to update the model stored in the memory.

11. The method of claim 9, wherein the different frequencies of the perturbation signals satisfy a condition of convergence, such that a sum of a first frequency of a first perturbation signal and a second frequency of a second perturbation signal of the set is not equal to a third frequency of a third perturbation signal.

12. The method of claim 9, wherein each of the different frequencies is greater than a frequency response of the battery.

13. A system for estimating a state of a battery, comprising:
a sensor to measure physical quantities of the battery indicative of a charge of the battery to produce a measured charge of the battery, wherein the physical quantities include a current passing through a circuit of the battery, a voltage on terminals of the battery, or both;
a memory to store a resistor-capacitor (RC) model of the battery, wherein the RC model includes at least one resistor and at least one capacitor, wherein parameters of the RC model include at least one value of resistance of the at least one resistor, and at least one value of capacitance of the capacitor;
a parameter learning controller to update at least one parameter of the RC model of the battery to reduce a difference between the measured charge of the battery and a charge of the battery estimated using the RC model of the battery, so as to update the RC model, wherein the parameter learning controller is a extremum seeking controller iteratively perturbs the at least one parameter of the RC model with a perturbation signal having a predetermined frequency until a termination condition is met; and
a processor to determine the state of the battery using the updated RC model of the battery.

14. The system of claim 1, wherein the extremum-seeking controller is configured for
multiplying a cost function of the difference between the measured charge of the battery and the estimated charge of the battery with a first periodic signal of time to produce a perturbed cost function;
subtracting from the perturbed cost function a second periodic signal having a ninety degrees quadrature phase shift with respect to a phase of the first periodic signal to produce a derivative of a gain function; and
integrating the derivative of the gain function over time to update the parameter of the model as the function of time.

15. The system of claim 1, wherein the model of the battery is an electrical model of a circuit formed by electrical components of the battery, and wherein the extremum seeking controller is a multi-parameter extremum-seeking updating concurrently parameters of a plurality of components of the electrical model.

16. The system of claim 13, wherein the sensor includes one or combination of a ammeter and a voltmeter, such that the measured charge of the battery includes one or combination of the measured voltage of the battery and the measured current of the battery, and the estimated charge of the battery includes one or combination of the estimated voltage of the battery and the estimated current of the battery.

17. The system of claim 13, wherein the state of the battery includes one or combination of a state-of-charge (SOC) of the battery, a state-of-health (SOH) of the battery, a state-of-power (SOP) of the battery, and a depth-of-discharge (DOD) of the battery, further comprising:
an output interface for rendering the state of the battery.

18. A non-transitory computer readable storage medium embodied thereon a program executable by a processor for performing a method, the method comprising:
determining, using a sensor, physical quantities including a current passing through a circuit of the battery, a voltage on terminals of the battery, or both, indicative of a charge of the battery to produce a measured charge of the battery, wherein the measured charge of the battery includes one or combination of the measured voltage of the battery and the measured current of the battery;
estimating the physical quantities of the battery using a model of the battery stored in a memory to produce an estimated charge of the battery, wherein the estimated charge of the battery includes one or combination of the estimated voltage of the battery and the estimated current of the battery;
updating at least one parameter of the model including a value of resistance or a value of capacitance of the battery to reduce a difference between the measured charge of the battery and the estimated charge of the battery, wherein the updating uses a model-free extremum-seeking iteratively perturbing the at least one parameter of the model with a perturbation signal having a predetermined frequency until a termination condition is met; and
determining the state of the battery using the updated model of the battery.

* * * * *